US010793267B2

(12) United States Patent
Lee et al.

(10) Patent No.: US 10,793,267 B2
(45) Date of Patent: Oct. 6, 2020

(54) UNMANNED AERIAL VEHICLE

(71) Applicant: SAMSUNG ELECTRONICS CO., LTD., Suwon-si, Gyeonggi-do (KR)

(72) Inventors: Wu Seong Lee, Asan-si (KR); Tae Kyun Kim, Suwon-si (KR); Bae Seok Lim, Suwon-si (KR); Youn Hyung Choi, Suwon-si (KR); Seung Nyun Kim, Incheon (KR); Yong Sang Yun, Osan-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 375 days.

(21) Appl. No.: 15/822,619

(22) Filed: Nov. 27, 2017

(65) Prior Publication Data

US 2018/0155024 A1 Jun. 7, 2018

(30) Foreign Application Priority Data

Dec. 1, 2016 (KR) .................... 10-2016-0163039

(51) Int. Cl.
*B64D 39/02* (2006.01)
*B64C 39/02* (2006.01)
(Continued)

(52) U.S. Cl.
CPC ............ *B64C 39/024* (2013.01); *B64D 27/24* (2013.01); *B64D 47/08* (2013.01);
(Continued)

(58) Field of Classification Search
CPC ........ B64C 2201/024; B64C 2201/042; B64C 2201/165; B64C 27/08; B64C 27/12;
(Continued)

(56) References Cited

U.S. PATENT DOCUMENTS 8,774,982 B2 7/2014 Oakley et al.
9,213,046 B2 12/2015 Wang
(Continued)

FOREIGN PATENT DOCUMENTS

JP 2013-540987 11/2013
KR 10-1042200 6/2011
(Continued)

OTHER PUBLICATIONS

Search Report and Written Opinion dated Mar. 8, 2018 in counterpart International Patent Application No. PCT/KR2017/013205.

*Primary Examiner* — Claude J Brown
(74) *Attorney, Agent, or Firm* — Nixon & Vanderhye P.C.

(57) ABSTRACT

Disclosed are a body of an unmanned aerial vehicle and an unmanned aerial vehicle including the same. The body includes a housing arranged in a first direction and including at least four housing sidewalls and an opening defined by the housing sidewalls and configured to receive a battery pack, a propeller support extending a specific distance from each housing sidewall in a second direction away from the center of the housing and perpendicular to the first direction and having, on a distal end, a motor and a propeller connected to the motor, and a PCB disposed on at least one of the housing sidewalls and associated with operating the motor and the propeller.

20 Claims, 13 Drawing Sheets

(51) Int. Cl.
*B64D 27/24* (2006.01)
*B64D 47/08* (2006.01)
*H05K 1/14* (2006.01)
*H05K 1/18* (2006.01)

(52) U.S. Cl.
CPC .. *B64C 2201/024* (2013.01); *B64C 2201/027* (2013.01); *B64C 2201/042* (2013.01); *B64C 2201/108* (2013.01); *B64C 2201/127* (2013.01); *B64C 2201/146* (2013.01); *B64C 2201/165* (2013.01); *B64D 2221/00* (2013.01); *H05K 1/148* (2013.01); *H05K 1/181* (2013.01); *H05K 2201/047* (2013.01); *H05K 2201/10151* (2013.01)

(58) Field of Classification Search
CPC .... B64D 2221/00; B64D 27/24; H05K 1/148; H05K 2201/047; Y02T 50/53; Y02T 50/54
USPC .......................................................... 244/54
See application file for complete search history.

(56) References Cited

U.S. PATENT DOCUMENTS

| | | |
|---|---|---|
| 9,456,185 B2 | 9/2016 | Oakley et al. |
| 9,616,998 B2 | 4/2017 | Oakley et al. |
| 2010/0120273 A1 | 5/2010 | Lucero et al. |
| 2012/0056041 A1 | 3/2012 | Rhee et al. |
| 2012/0083945 A1 | 4/2012 | Oakley et al. |
| 2013/0111993 A1 | 5/2013 | Wang |
| 2014/0231582 A1 | 8/2014 | Headrick |
| 2015/0232181 A1 | 8/2015 | Oakley et al. |
| 2015/0298799 A1* | 10/2015 | Bertrand ................ A63H 27/12 701/23 |
| 2015/0360778 A1* | 12/2015 | Christensen ........... A63H 17/28 244/17.11 |
| 2016/0097793 A1 | 4/2016 | Wang |
| 2017/0118838 A1* | 4/2017 | Williams ............. H05K 3/4691 |
| 2017/0313418 A1 | 11/2017 | Yoon |
| 2018/0002035 A1* | 1/2018 | Neely .................... B64D 47/08 |
| 2019/0071180 A1* | 3/2019 | Qiu ..................... H01M 2/1083 |

FOREIGN PATENT DOCUMENTS

| | | |
|---|---|---|
| KR | 10-1564380 | 10/2015 |
| KR | 10-2016-0041697 | 4/2016 |

\* cited by examiner

UNMANNED AERIAL VEHICLE

CROSS-REFERENCE TO RELATED APPLICATION

This application is based on and claims the benefit under 35 U.S.C. § 119 to a Korean patent application filed on Dec. 1, 2016 in the Korean Intellectual Property Office and assigned Serial number 10-2016-163039, the disclosure of which is incorporated by reference herein in its entirety.

TECHNICAL FIELD

The present disclosure relates generally to an unmanned aerial vehicle.

BACKGROUND

An unmanned aerial vehicle (UAV) is generally referred to as various forms of names, such as a drone, an unmanned aircraft system (UAS), and the like. Unmanned aerial vehicles may be manufactured to perform specified missions without a human pilot aboard. Unmanned aerial vehicles may be controlled wirelessly from a distance by a remote controller. Unmanned aerial vehicles (UAVs) may be used in aerial photography using a camera, an industrial application, such as crop-dusting, and a recreational application.

Unmanned aerial vehicles are implemented in various shapes and sizes from a palm-sized fuselage to a large-sized fuselage having a diameter of several meters. Since large-sized unmanned aerial vehicles of a specific size or more have a body larger than main components (e.g., a battery, a board, a connector, and the like), the large-sized unmanned aerial vehicles may be free from design limitations or performance degradation according to mounting structures of the main components.

Meanwhile, even though an unmanned aerial vehicle is small in size, there is difficulty in manufacturing the unmanned aerial vehicle in a specific small size or less. For example, since a basic board and a battery must have a specific size or more even though an unmanned aerial vehicle is small in size, there is difficulty in making the unmanned aerial vehicle compact, and thrust efficiency may be degraded by interference between propellers and a body according to a mounting structure.

SUMMARY

Example aspects of the present disclosure address at least the above-mentioned problems and/or disadvantages and provide at least the advantages described below. Accordingly, an example aspect of the present disclosure is to provide a structure of a stable and thrust-efficient small-sized unmanned aerial vehicle by mounting a board, a battery, or the like on a body of the unmanned aerial vehicle.

As described above, according to various example embodiments, it is possible to provide a structure of an unmanned aerial vehicle that prevents and/or reduces interference between a body region and a propeller operating region, thereby providing a compact structure of the body of the unmanned aerial vehicle.

In accordance with an example aspect of the present disclosure, an unmanned aerial vehicle is provided. The unmanned aerial vehicle may include a housing including an outer surface, an opening formed on the outer surface, and an inner structure disposed inside the housing, the inner structure including an inner surface and an outer surface that define an inner space, wherein the opening and the inner space are at least partially aligned with each other in a first direction, a battery mounted in the inner space, wherein the battery is configured to slide into the inner space through the opening, at least one propeller mounted on the housing or connected to the housing, the at least one propeller being connected to the housing to rotate about an axis extending in the first direction, at least one motor configured to operate the at least one propeller, at least one printed circuit board (PCB) mounted on the outer surface of the inner structure, the at least one PCB is arranged to be substantially perpendicular to the first direction, and a power management circuit mounted on the at least one PCB and electrically connected with the battery and the at least one motor.

In accordance with another example aspect of the present disclosure, an unmanned aerial vehicle may include a housing arranged in a first direction, the housing including at least four housing sidewalls and an opening formed by the housing sidewalls, the opening configured to receive a battery pack, a propeller support extending a specific distance from each housing sidewall in a second direction away from a center of the housing and perpendicular to the first direction, the propeller support having a motor and a propeller connected to the motor disposed on a distal end, and a PCB disposed on at least one of the housing sidewalls, the PCB being associated with operating the motor and the propeller.

In accordance with another example aspect of the present disclosure, an unmanned aerial vehicle may include a battery pack, a casing arranged in a first direction and including at least four casing sidewalls and an opening formed by the casing sidewalls, the opening being configured to receive the battery pack, a housing into which the casing is inserted, a PCB disposed on at least one of sidewalls of the housing, a motor configured to operate under control of the PCB, a propeller connected to the motor, a camera configured to take an image under control of the PCB, a sensor configured to perform a specified sensing operation under control of the PCB, and a mesh-type protective structure configured to fix the housing and the motor and to surround the housing and the propeller.

Other aspects, advantages, and salient features of the disclosure will become apparent to those skilled in the art from the following detailed description, which, taken in conjunction with the annexed drawings, discloses various example embodiments of the present disclosure.

BRIEF DESCRIPTION OF THE DRAWINGS

The above and other aspects, features, and attendant advantages of the present disclosure will be more apparent and readily appreciated from the following detailed description, taken in conjunction with the accompanying drawings, in which like reference numerals refer to like elements, and wherein.

Throughout the drawings, it should be noted that like reference numbers are used to depict the same or similar elements, features, and structures.

DETAILED DESCRIPTION

Figure 1:
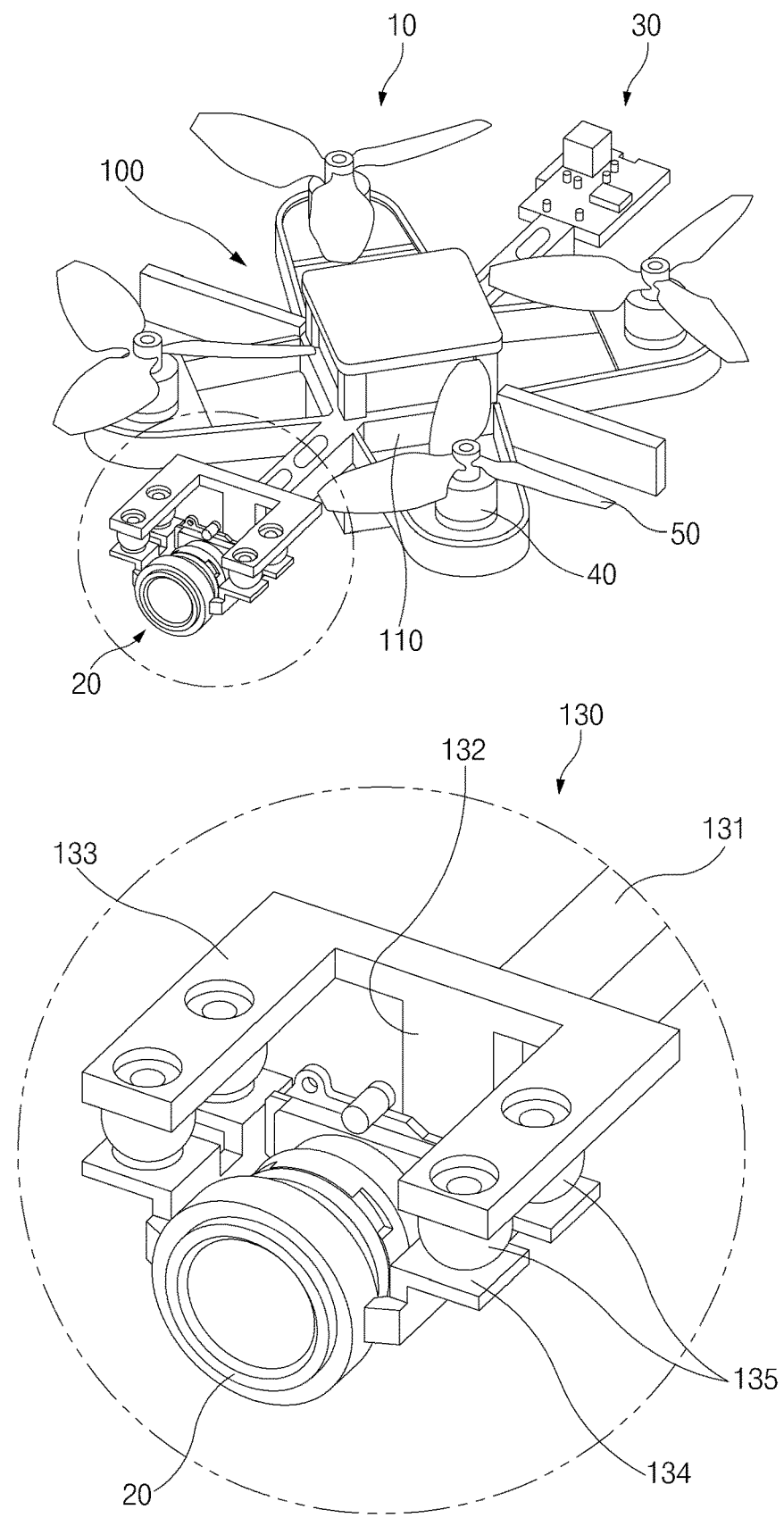
FIG. 1 is a diagram illustrating an example structure of an unmanned aerial vehicle according to an example embodiment of the present disclosure.

Various example embodiments of the present disclosure may be described with reference to accompanying drawings. Accordingly, those of ordinary skill in the art will recognize that many modifications, equivalents, and/or alternatives of the various embodiments described herein can be variously made without departing from the scope and spirit of the present disclosure. With regard to description of drawings, similar elements may be marked by similar reference numerals.

In the disclosure disclosed herein, the expressions "have", "may have", "include" and "comprise", or "may include" and "may comprise" used herein indicate existence of corresponding features (e.g., elements such as numeric values, functions, operations, or components) but do not exclude presence of additional features.

In the disclosure disclosed herein, the expressions "A or B", "at least one of A or/and B", or "one or more of A or/and B", and the like used herein may include any and all combinations of one or more of the associated listed items. For example, the term "A or B", "at least one of A and B", or "at least one of A or B" may refer to all of the case (1) where at least one A is included, the case (2) where at least one B is included, or the case (3) where both of at least one A and at least one B are included.

The terms, such as "first", "second", and the like used herein may refer to various elements of various embodiments, but do not limit the elements. Furthermore, such terms may be used to distinguish one element from another element. For example, "a first user device" and "a second user device" may indicate different user devices regardless of the order or priority thereof. For example, "a first user device" and "a second user device" indicate different user devices.

It will be understood that when an element (e.g., a first element) is referred to as being "(operatively or communicatively) coupled with/to" or "connected to" another element (e.g., a second element), it may be directly coupled with/to or connected to the other element or an intervening element (e.g., a third element) may be present. On the other hand, when an element (e.g., a first element) is referred to as being "directly coupled with/to" or "directly connected to" another element (e.g., a second element), it should be understood that there are no intervening elements (e.g., a third element).

According to the situation, the expression "configured to" used herein may be used interchangeably with, for example, the expression "suitable for", "having the capacity to", "designed to", "adapted to", "made to", or "capable of". The term "configured to" does not refer only to "specifically designed to" in hardware. Instead, the expression "a device configured to" may refer to a situation in which the device is "capable of" operating together with another device or other components. For example, a "processor configured to perform A, B, and C" may refer, for example, and without limitation, to a dedicated processor (e.g., an embedded processor) for performing a corresponding operation or a generic-purpose processor (e.g., a central processing unit (CPU) or an application processor) which may perform corresponding operations by executing one or more software programs which are stored in a memory device, or the like.

Terms used in the present disclosure are used to describe specified embodiments and are not intended to limit the scope of the present disclosure. The terms of a singular form may include plural forms unless otherwise specified. Unless otherwise defined herein, all the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal detect unless expressly so defined herein in various embodiments of the present disclosure. In some cases, even if terms are terms which are defined in the disclosure, they may not be interpreted to exclude embodiments of the present disclosure.

An electronic device according to various embodiments of the present disclosure may include at least one of smartphones, tablet personal computers (PCs), mobile phones, video telephones, e-book readers, desktop PCs, laptop PCs, netbook computers, workstations, servers, personal digital assistants (PDAs), portable multimedia players (PMPs), Motion Picture Experts Group (MPEG-1 or MPEG-2) Audio Layer 3 (MP3) players, mobile medical devices, cameras, wearable devices (e.g., head-mounted-devices (HMDs), such as electronic glasses), an electronic apparel, electronic bracelets, electronic necklaces, electronic appcessories, electronic tattoos, smart watches, or the like, but is not limited thereto.

According to another embodiment, the electronic device may include various home appliances. The home appliances may include at least one of, for example, televisions (TVs), digital versatile disc (DVD) players, audios, refrigerators, air conditioners, cleaners, ovens, microwave ovens, washing machines, air cleaners, set-top boxes, home automation control panels, security control panels, TV boxes (e.g., Samsung HOMESYNC™, APPLE TV™, or GOOGLE TV™), game consoles (e.g., XBOX™ or PLAYSTA- TION™), electronic dictionaries, electronic keys, camcorders, electronic picture frames, or the like, but are not limited thereto.

According to another embodiment, the electronic apparatus may include at least one of medical devices (e.g., various portable medical measurement devices (e.g., a blood glucose monitoring device, a heartbeat measuring device, a blood pressure measuring device, a body temperature measuring device, and the like)), a magnetic resonance angiography (MRA), a magnetic resonance imaging (MRI), a computed tomography (CT), scanners, and ultrasonic devices), navigation devices, global positioning system (GPS) receivers, event data recorders (EDRs), flight data recorders (FDRs), vehicle infotainment devices, electronic equipment for vessels (e.g., navigation systems and gyrocompasses), avionics, security devices, head units for vehicles, industrial or home robots, automatic teller's machines (ATMs), points of sales (POSs), or internet of things (e.g., light bulbs, various sensors, electric or gas meters, sprinkler devices, fire alarms, thermostats, street lamps, toasters, exercise equipment, hot water tanks, heaters, boilers, and the like), or the like, but is not limited thereto.

According to another embodiment, the electronic devices may include at least one of parts of furniture or buildings/structures, electronic boards, electronic signature receiving devices, projectors, or various measuring instruments (e.g., water meters, electricity meters, gas meters, or wave meters, and the like), or the like, but are not limited thereto. In the various embodiments, the electronic device may be one of the above-described various devices or a combination thereof. An electronic device according to an embodiment may be a flexible device. Furthermore, an electronic device according to an embodiment may not be limited to the above-described electronic devices and may include other electronic devices and new electronic devices according to the development of technologies.

Hereinafter, an electronic device according to the various embodiments may be described in greater detail with reference to the accompanying drawings. The term "user" used herein may refer to a person who uses an electronic device or may refer to a device (e.g., an artificial intelligence electronic device) that uses an electronic device.

Figure 2:
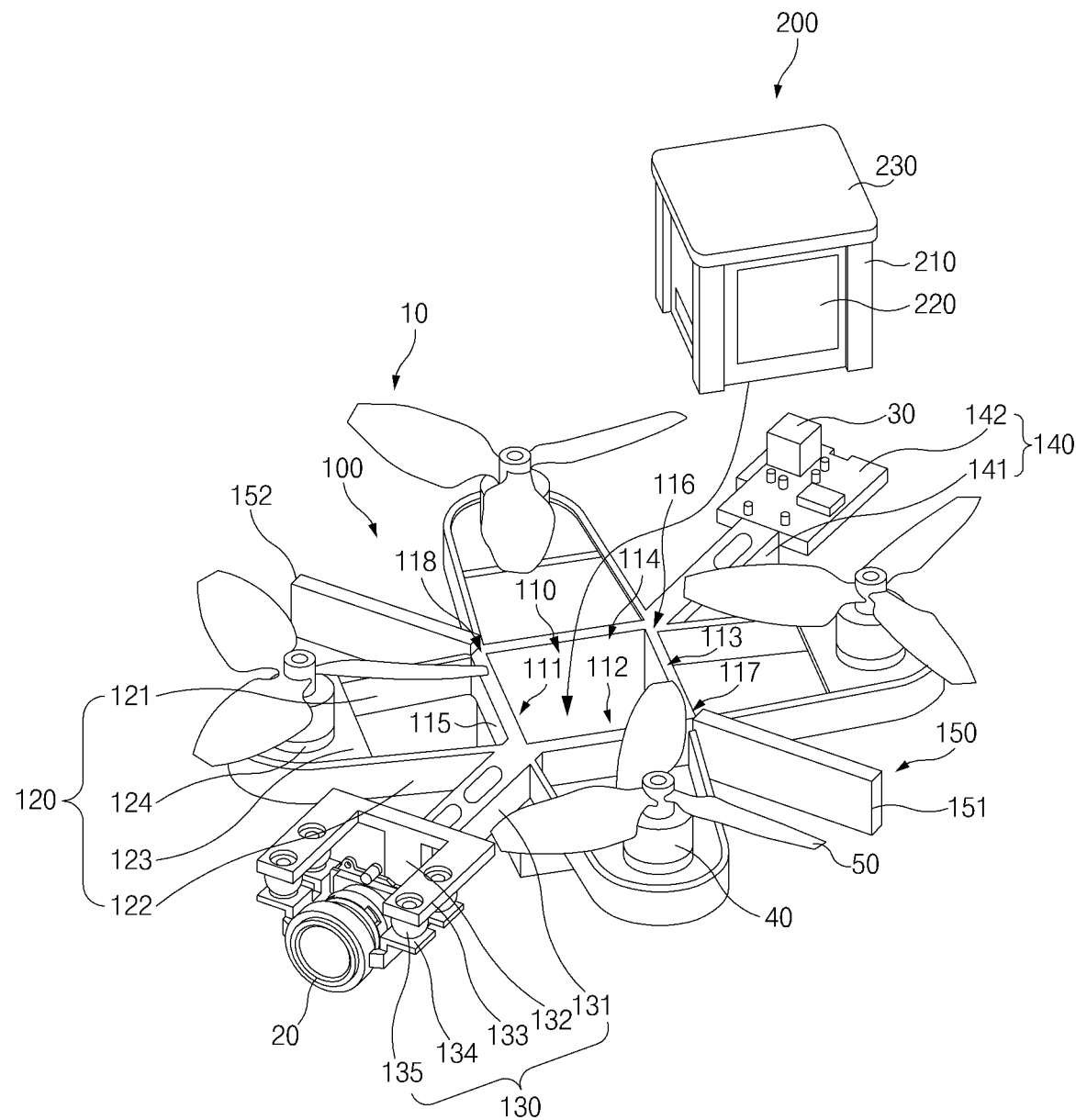
FIG. 2 is a diagram illustrating an example state in which a drive device and a housing of the unmanned aerial vehicle are separated from each other, according to an example embodiment of the present disclosure.

FIG. 1 is a diagram illustrating an example structure of an unmanned aerial vehicle according to an example embodiment of the present disclosure, and FIG. 2 is a diagram illustrating an example=state in which a drive device and a housing of the unmanned aerial vehicle are separated from each other, according to an example embodiment of the present disclosure.

Referring to FIGS. 1 and 2, an unmanned aerial vehicle 10 according to an embodiment of the present disclosure may include a body 100, a drive device 200, a camera 20, a sensor 30, motors 40, and propellers 50. The aforementioned unmanned aerial vehicle 10 may include the cube-shaped body 100, and at least one side of the body 100 may be disposed to have a gap of a specified size from operating ranges of the propellers 50.

The body 100 according to an embodiment of the present disclosure may include the drive device 200 (e.g., a casing 210, a drive PCB 220, and/or a battery pack 230) of the unmanned aerial vehicle 10. The aforementioned body 100 may include a receiving space in which to receive the battery pack 230 included in the drive device 200. Furthermore, the body 100 may include a contact point (e.g., a contact, a connector, or the like) that is to be electrically connected with the battery pack 230. The aforementioned body 100 may include a housing 110, propeller supports 120 (or propeller support parts), a camera support 130 (or a camera support part), a sensor support 140 (or a sensor support part), and dummy supports 150 (or dummy support parts).

The housing 110 according to an embodiment of the present disclosure may, for example, and without limitation, have a hollow cube shape (e.g., a hollow rectangular prismatic shape). For example, the housing 110 may include four housing sidewalls: a first housing sidewall 111, a second housing sidewall 112, a third housing sidewall 113, and a fourth housing sidewall 114. The four housing sidewalls 111 to 114 of the housing 110 may be arranged in a rectangular prismatic shape in which two adjacent housing sidewalls share a corner with each other. The housing 110 may, for example, be open at the top, and at least part of the drive device 200 may, for example, be inserted into the housing 110 from above and may be mounted in the housing 110. The housing 110 may be open at the bottom and may further include a bottom part that closes the open bottom of the housing 110. While FIGS. 1 and 2 illustrate that the four housing sidewalls 111 to 114 have a straight cross-section, the present disclosure is not limited thereto. For example, the four housing sidewalls 111 to 114 may have a curved cross-section (e.g., a cross-section gradually inwardly curved from the top to the bottom of the housing 110 or from the bottom to the top thereof).

Each of the propeller supports 120 according to an embodiment of the present disclosure may extend from one side of the housing 110 in one direction and may support the propeller 50 and the motor 40 connected to a distal end thereof. As many propeller supports 120 as the propellers 50 may be included in the body 100. The propeller supports 120 may be symmetrically arranged on a horizontal plane with respect to the center point of the housing 110. For example, four propeller supports 120 may be arranged to face the four housing sidewalls 111 to 114 of the housing 110, respectively. Each propeller support 120 may include a motor base 124, a base support 123, a first motor support 121, and a second motor support 122.

The first motor support 121 according to an embodiment of the present disclosure may extend from, for example, one lateral edge of one housing sidewall at a specified angle with respect to the corresponding housing sidewall in a direction away from the center of the housing 110 (e.g., extend parallel to the bottom side or the open side of the housing 110). The first motor support 121 may have a specific length in the direction away from the center of the housing 110. According to an embodiment, the first motor support 121 may be longer than blades of the propeller 50.

The second motor support 122 according to an embodiment of the present disclosure may horizontally extend from, for example, an opposite lateral edge of the housing sidewall, from which the first motor support 121 extends, at a specified angle with respect to the corresponding housing sidewall in a direction away from the center of the housing 110. For example, the second motor support 122 may be arranged parallel to the first motor support 121. The second motor support 122 may have a shape similar to that of the first motor support 121 and may have a specific length in the direction away from the center of the housing 110. According to an embodiment, the second motor support 122 may be longer than the blades of the propeller 50.

The motor base 124 according to an embodiment of the present disclosure may be disposed at a specific distance (e.g., a distance longer than the blades of the propeller 50) from the housing sidewall of the housing 110. The motor 40 may be mounted on the motor base 124. The motor base 124 may have a circuit embedded therein for supplying electric power to the motor 40. The motor base 124 may be fixed to the housing 110 by the base support 123 and the first and second motor supports 121 and 122 connected to the base support 123.

The base support 123 according to an embodiment of the present disclosure may surround the periphery of the motor base 124. One side of the base support 123 may be connected with one end of the first motor support 121, and an opposite side of the base support 123 may be connected with one end of the second motor support 122. The base support 123 may have an electric cable disposed therein for supplying electric power to the motor 40 mounted on the motor base 124, or may have a signal pattern disposed on at least one surface thereof.

The camera support 130 according to an embodiment of the present disclosure may extend from one side of the housing 110 (e.g., a first corner 115 between the first housing sidewall 111 and the second housing sidewall 112) in a direction away from the center of the housing 110, and the camera 20 may be disposed on a distal end of the camera support 130. For example, the camera support 130 may extend from the corner of the housing 110 in a diagonal direction from the center of the housing 110. Accordingly, the camera support 130 may be arranged at a specific angle (e.g., an angle between 30 degrees and 60 degrees, for example, 45 degrees) with respect to the second motor support 122. The camera support 130 may include a camera support frame 131, a connecting frame 132, an upper frame 133, a lower frame 134, and dampers 135.

The camera support frame 131 according to an embodiment of the present disclosure may include, for example, a frame extending a specific distance from one side of the corner of the housing 110 in the diagonal direction. According to an embodiment, the camera support frame 131 may be implemented in a solid type having no space therein, or may have at least one empty space in at least part of the central portion thereof to reduce the weight while maintaining rigidity. According to an embodiment, the camera support frame 131 may include a block shape having an empty space in at least a portion thereof. The camera support frame 131 may have a shape, the top side of which has a smaller area than lateral sides, or may have an overall prismatic shape with a square cross-section. According to various embodiments, the camera support frame 131 may have a circular cylindrical shape with a circular cross-section. According to various embodiments, interconnection wiring for signal transmission or power supply to the camera 20 may be disposed inside the camera support frame 131 or on at least part of an outer surface thereof.

The connecting frame 132 according to an embodiment of the present disclosure may be disposed on a distal end of the camera support frame 131. For example, the connecting frame 132 may be arranged perpendicular to the camera support frame 131 and may have a specific length. The upper frame 133 may be connected to an upper end of the connecting frame 132, and the lower frame 134 (or a link) may be connected to a lower end of the connecting frame 132. Interconnection wiring for signal transmission or power supply to the camera 20 may be disposed inside the connecting frame 132 or on at least part of an outer surface thereof, and may be electrically connected with the interconnection wiring disposed inside the camera support frame 131 or on the outside thereof. According to an embodiment, the interconnection wiring disposed inside the connecting frame 132 or on the outside thereof may be connected with the camera 20, which is mounted on at least one side of the lower frame 134, through the lower frame 134.

The upper frame 133 according to an embodiment of the present disclosure may be partly connected with one side of an upper end of the connecting frame 132 and may have an overall C-shape. A distal end portion of the upper frame 133 may be disposed to have a specific gap from a distal end portion of the lower frame 134. The dampers 135 may be disposed below the distal end portion of the upper frame 133.

The lower frame 134 according to an embodiment of the present disclosure may include at least one ring part having a semicircular or ring shape that surrounds the camera 20 and a plurality of damper support parts provided on opposite ends of the ring part to face the upper frame 133. The dampers 135 may be disposed on the damper support parts.

The dampers 135 according to an embodiment of the present disclosure may be disposed between the upper frame 133 and the lower frame 134. The dampers 135 may have, for example, a spherical shape, as illustrated in FIGS. 1 and 2, and may have a specific elastic force. While FIGS. 1 and 2 illustrate that the four dampers 135 are arranged, the present disclosure is not limited thereto. A plurality of dampers 135, for example, two or more dampers 135 may be provided. The dampers 135 may serve to absorb shocks to prevent and/or reduce vibration generated in the unmanned aerial vehicle 10 from being transmitted to the camera 20. While FIGS. 1 and 2 illustrate that the dampers 135 are connected parallel to the upper frame 133 and the lower frame 134, the present disclosure may not be limited thereto.

The sensor support 140 according to an embodiment of the present disclosure may extend a specific distance from one of the corners of the housing 110 (e.g., a third corner 116 between the third housing sidewall 113 and the fourth housing sidewall 114) in a direction away from the center of the housing 110. According to an embodiment, the sensor support 140 may be disposed symmetrical to the camera support 130 with respect to the center of the housing 110. The sensor support 140 may include a sensor support frame 141 and a support plate 142.

The sensor support frame 141 according to an embodiment of the present disclosure may extend a specific distance from one side of the housing 110, for example, the corner of the housing 110 in the direction away from the center of the housing 110. According to an embodiment, the sensor support frame 141 may have the same shape as, or a shape similar to, that of the camera support frame 131. The sensor support frame 141 may be spaced circumferentially apart from the propeller supports 120 adjacent thereto by a specific angle (e.g., an angle between 30 degrees and 60 degrees, for example, 45 degrees). A signal line for supplying signals and power necessary for operating the sensor 30 may be disposed inside the sensor support frame 141 or on at least part of an outer surface thereof. The support plate 142 may be disposed on a distal end of the sensor support frame 141 to support the sensor 30. According to an embodiment, the support plate 142 may have a rectangular shape with a predetermine area and thickness. The rectangular support plate 142 is merely illustrative, and the shape of the support plate 142 may be replaced with various shapes, such as a polygonal shape, a circular shape, and the like. A signal line relating to the supply of signals and power necessary for operating the sensor 30 may be disposed on the support plate 142 and may be electrically connected with the signal line disposed inside the sensor support frame 141 or on the outside thereof. The sensor 30 may be disposed on the support plate 142. The sensor 30 may transmit a sensor signal downwards and may receive a sensor signal from below based on the illustrated drawings. Accordingly, the support plate 142 may have a through-hole formed on a side thereof to allow the sensor 30 to transmit and receive sensor signals. Alternatively, the sensor 30 may be disposed on the periphery of the support plate 142 or on the bottom side thereof to transmit a sensor signal below the support plate 142 or to receive a sensor signal from below.

Each of the dummy supports 150 according to an embodiment of the present disclosure may extend from one side of the housing 110 (e.g., a second corner 117 between the second housing sidewall 112 and the third housing sidewall 113 or a fourth corner 118 between the first housing sidewall 111 and the fourth housing sidewall 114) in a direction away from the center of the housing 110. As illustrated in FIGS. 1 and 2, the dummy supports 150 may include a first dummy support 151 disposed on a right side of the camera support 130 and the sensor support 140 and a second dummy support 152 disposed on a left side thereof. The first dummy support 151 and the second dummy support 152 may be arranged at an angle of 90 degrees with respect to the camera support 130 or the sensor support 140. The dummy supports 150 may have a shape, the top side of which has a smaller area than lateral sides. For example, the dummy supports 150 may have a rectangular panel shape standing upright. The dummy supports 150 may be disposed to balance the camera support 130 and the sensor support 140. Accordingly, the dummy supports 150 may have the same weight as, or a weight similar to, the weight of the camera support 130 and the camera 20 or the weight of the sensor support 140 and the sensor 30.

The drive device 200 according to an embodiment of the present disclosure may include the drive PCB 220, the casing 210, and the battery pack 230.

The drive PCB 220 according to an embodiment of the present disclosure may include at least some of a movement control circuit for controlling the motors 40 of the unmanned aerial vehicle 10, a camera control circuit for controlling the camera 20, and a sensor control circuit for controlling the sensor 30. The drive PCB 220 may control the flight attitude and path of the unmanned aerial vehicle 10. The drive PCB 220 according to an embodiment of the present disclosure may include a plurality of rigid PCBs including a plurality of control circuits, respectively, and at least one flexible PCB electrically connecting the rigid PCBs. The drive PCB 220 may be fixed to the casing 210.

The casing 210 according to an embodiment of the present disclosure may have the drive PCB 220 disposed on an outer surface thereof. In this regard, the casing 210 may include a mounting part on which the drive PCB 220 is mounted and a fixation hole (e.g., a boss) for fixing the drive PCB 220. The casing 210 may have a specific shape inserted into the housing 110. For example, in the case where the housing 110 has a hollow rectangular prismatic shape, at least part of the casing 210 may have a rectangular prismatic shape that has a cross-sectional area smaller than or equal to that of the hollow interior of the housing 110. The casing 210 may have an empty space inside, and at least part of the battery pack 230 may be mounted in the casing 210. The casing 210 may have a jack disposed on one side thereof, and the jack may be electrically connected with a connector provided on the battery pack 230. The casing 210 may have a polygonal prismatic shape with a hollow interior extending through the top and bottom thereof, or may have a polygonal prismatic shape that is open at only the top thereof.

The battery pack 230 according to an embodiment of the present disclosure may be a device for supplying electric power to the unmanned aerial vehicle 10. The battery pack 230 may be configured in a removable structure to enable replacement of a battery. The battery pack 230 may be temporarily fixed to one side of the casing 210 and may be received in the casing 210. The battery pack 230 may further include a battery pack circuit that includes a battery protection circuit. The battery pack 230 may further include a separate key-input structure on an upper surface thereof. The battery pack circuit including a key-input means may be electrically connected with the drive PCB 220 through the connector.

The camera 20 according to an embodiment of the present disclosure may take an image in at least one specified direction. The camera 20 may include a plurality of cameras and may be installed in a separate gimbal module. According to various embodiments, the camera 20 may be connected to the distal end of the camera support 130. The camera support 130 connected with the camera 20 may be located beyond the radius of rotation of the propellers 50.

The sensor 30 according to an embodiment of the present disclosure may include, for example, and without limitation, an acceleration sensor, a grip sensor, a geo-magnetic sensor, an optical fiber sensor (OFS), a time of flight (TOF) sensor, or the like. The sensor 30 may generate a signal used for flight control of the unmanned aerial vehicle 10. According to various embodiments, the sensor 30 may be disposed in the interior of, or on the exterior of, the body 100. In the case where the sensor 30 is disposed on the exterior of the body 100, the sensor 30 may be positioned symmetrical to the camera 20, as illustrated in FIGS. 1 and 2, to balance the body 100.

The motors 40 according to an embodiment of the present disclosure may be connected with the propellers 50, respectively, and may be driven in at least one direction by electric power supplied thereto. According to an embodiment, the motors 40 may be driven in a direction in which the propellers 50 generate lift. Each motor 40 may be mounted on and fixed to the corresponding motor base 124 and may be driven by electric power supplied from the battery pack 230. As many motors 40 as the propellers 50 may be included. For example, in the case where four propellers 50 are arranged, four motors 40 may be arranged to be coupled with the four propellers 50, respectively.

The propellers 50 according to an embodiment of the present disclosure may be connected to the motors 40, respectively, and may rotate in at least one direction as the motors 40 rotate. In the case where the propellers 50 rotate in one direction, the unmanned aerial vehicle 10 may move upwards into the air, based on a lift force generated by the propellers 50 that allow air to flow downwards from above the propellers 50. The unmanned aerial vehicle 10 may be configured such that the body 100 does not overlap the radius of rotation of the propellers 50 since wind passages may be affected in the case where some areas of the body 100 are located within the radius of rotation of the propellers 50.

As described above, the unmanned aerial vehicle 10 according to an embodiment of the present disclosure may have a structure in which the cube-shaped housing 110 is disposed in the central space of the body 100 that does not overlap the operating ranges of the plurality of propellers 50, and the battery pack 230 and the drive PCB 220 are disposed in the housing 110. Therefore, the unmanned aerial vehicle 10 may have a form in which the plurality of rigid PCBs necessary for operating the unmanned aerial vehicle 10 are arranged vertically to the direction of the housing 110, thereby minimizing space and thus achieving optimization of the unmanned aerial vehicle 10.

Figure 3:
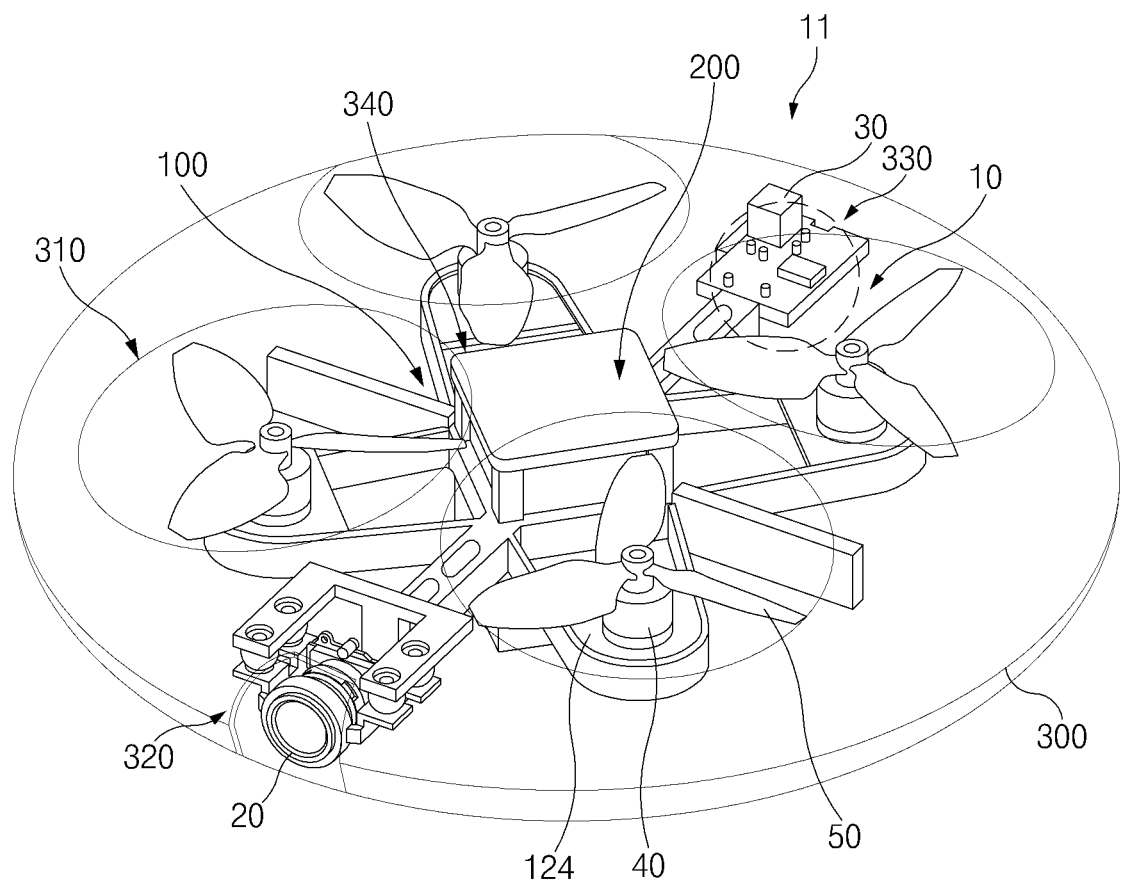
FIG. 3 is a diagram illustrating an example unmanned aircraft system according to an example embodiment of the present disclosure.

FIG. 3 is a diagram illustrating an example unmanned aircraft system according to an example embodiment of the present disclosure.

Referring to FIG. 3, an unmanned aircraft system 11 according to an embodiment of the present disclosure may include the unmanned aerial vehicle 10 illustrated in FIG. 2 and a protective structure 300.

As described above, the unmanned aerial vehicle 10 according to an embodiment of the present disclosure may include the body 100, the drive device 200, the camera 20, the sensor 30, the motors 40, and the propellers 50. The housing 110 may be disposed in the central portion of the body 100, and the casing 210 to which the drive PCB 220 and the battery pack 230 are fixed may be mounted in the housing 110.

The protective structure 300 according to an embodiment of the present disclosure may include, for example, and without limitation, a mesh-type protective structure and may reduce accidents occurring in a case of a collision of the unmanned aerial vehicle 10. For example, a person may be injured when colliding with the propellers 50. However, the protective structure 300 may collide with the person before the propellers 50 to reduce the risk of accidents caused by the propellers 50. In another example, when the unmanned aerial vehicle 10 collides with the ground, the protective structure 300 may prevent and/or reduce a direct collision of the propellers 50 to avoid damage to the propellers 50.

The protective structure 300 according to an embodiment of the present disclosure may include, for example, propeller openings 310, a camera opening 320, a sensor opening 330, and a battery opening 340. The protective structure 300 may have a larger diameter than a circle with a radius from the center of the housing 110 to the operating range of each propeller 50 through the center point of the propeller 50. For example, the protective structure 300 may have a circular shape that has a specific distance covering the peripheries of the propeller openings 310 as a diameter. Furthermore, the central portion of the protective structure 300 may have a height corresponding to the height of the housing 110 or the height of the drive device 200 inserted into the housing 110. The peripheral portion of the protective structure 300 may have a height greater than the sum of the height of the propeller 50, the height of the motor 40, and the height of the motor base 124. According to an embodiment, the protective structure 300 may have a gradually decreasing height from the center to the periphery thereof.

The propeller openings 310 according to an embodiment of the present disclosure may be formed in regions in which the propellers 50 are disposed, and may have a through-hole shape formed in the vertical direction of the propellers 50. In the case where four propellers 50 are arranged, four propeller openings 310 may be formed. For example, the propeller openings 310 may have a minimum diameter larger than the diameter of a circle with a radius equal to the length of blades of the propellers 50. Furthermore, the propeller openings 310 may have a maximum diameter that does not overlap the operating ranges of the other adjacent propellers 50.

The camera opening 320 according to an embodiment of the present disclosure may be formed in a region in which the camera 20 is disposed, and the camera 20 may be exposed to the outside through the camera opening 320. The camera opening 320 may be formed in a lateral portion of the protective structure 300 since the camera 20 is arranged toward a lateral side. The camera opening 320 may have, for example, a circular or polygonal shape. According to various embodiments, the camera opening 320 may have a shape that includes a lateral portion of the protective structure 300, part of an upper end of the protective structure 300, and part of a lower end of the protective structure 300. Accordingly, the camera 20 may take an image while rotating upwards or downwards to a specified angle with respect to the horizontal plane.

The sensor opening 330 according to an embodiment of the present disclosure may be formed in a lateral portion of the protective structure 300 or in a lower outer peripheral portion of the protective structure 300. The sensor opening 330 may be located in the region in which the sensor 30 is disposed, to allow the sensor 30 to transmit a sensor signal downwards and receive a sensor signal from below, as described above. The sensor opening 330 may have any shape (e.g., a circular or polygonal shape) capable of exposing, to the outside, a device that transmits a signal in the sensor 30.

The battery opening 340 according to an embodiment of the present disclosure may be located in the central portion of the protective structure 300. The battery opening 340 may be formed through a region of the protective structure 300 above the housing 110 such that the drive device 200 including the battery pack 230 is inserted, for example, and without limitation, from above the housing 110. The battery opening 340 may be formed in a size sufficient to insert the battery pack 230 (e.g., in a rectangular opening shape), or may be formed in a size corresponding to the cross-section of the drive device 200 including the battery pack 230.

Figure 4:
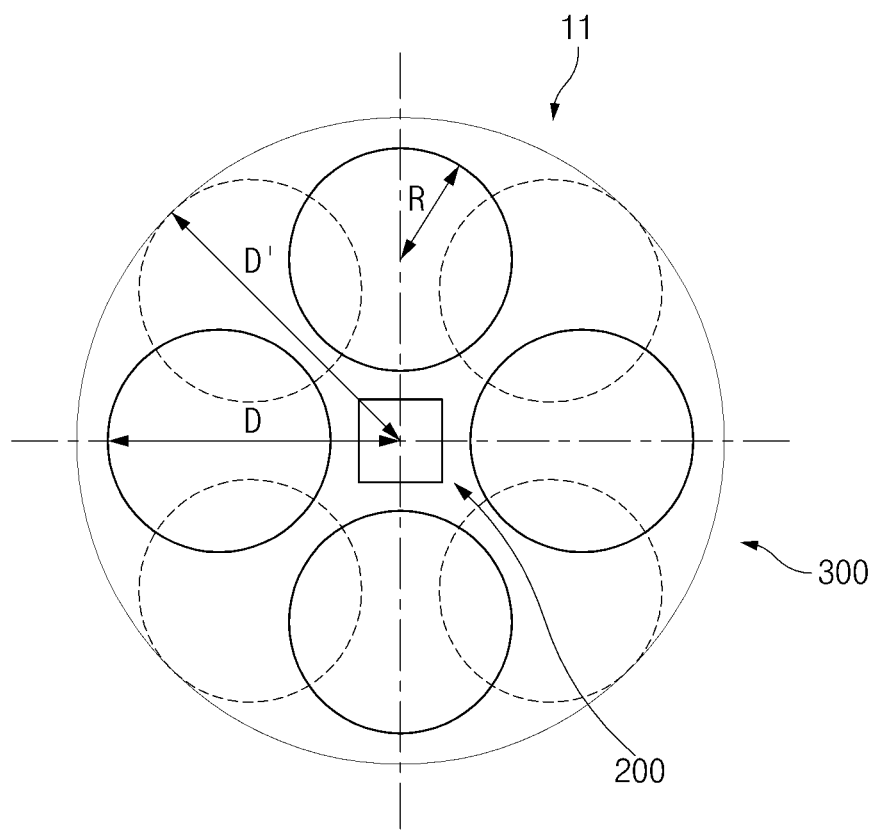
FIG. 4 is a diagram illustrating an example relationship between a propeller operating range and a body, according to an example embodiment of the present disclosure.

FIG. 4 is a diagram illustrating an example relation between a propeller operating range and a body, according to an example embodiment of the present disclosure.

Referring to FIGS. 3 and 4, the unmanned aerial vehicle 10 according to an embodiment of the present disclosure may include the plurality of motors 40 and propellers 50 arranged around the body 100. The body 100 may have a rectangular shape, and the motors 40 and the propellers 50 may be located with respect to axes extending from the centers of the respective sides of the body 100. For example, considering the radius of rotation R of the propellers 50, the distance D from the center of each side of the body 100 to the outermost point of the radius of rotation of the corresponding propeller 50 may be shorter than the distance D' from the corresponding corner of the body 100 to the outermost point of the radius of rotation of the propeller 50. The distance D may be associated with the size of the unmanned aerial vehicle 10. The unmanned aerial vehicle 10 may be made more compact with a decrease in the distance D, or a propulsive force for flight may be further generated by using propellers larger than those of an unmanned aerial vehicle of the same size.

Figure 5:
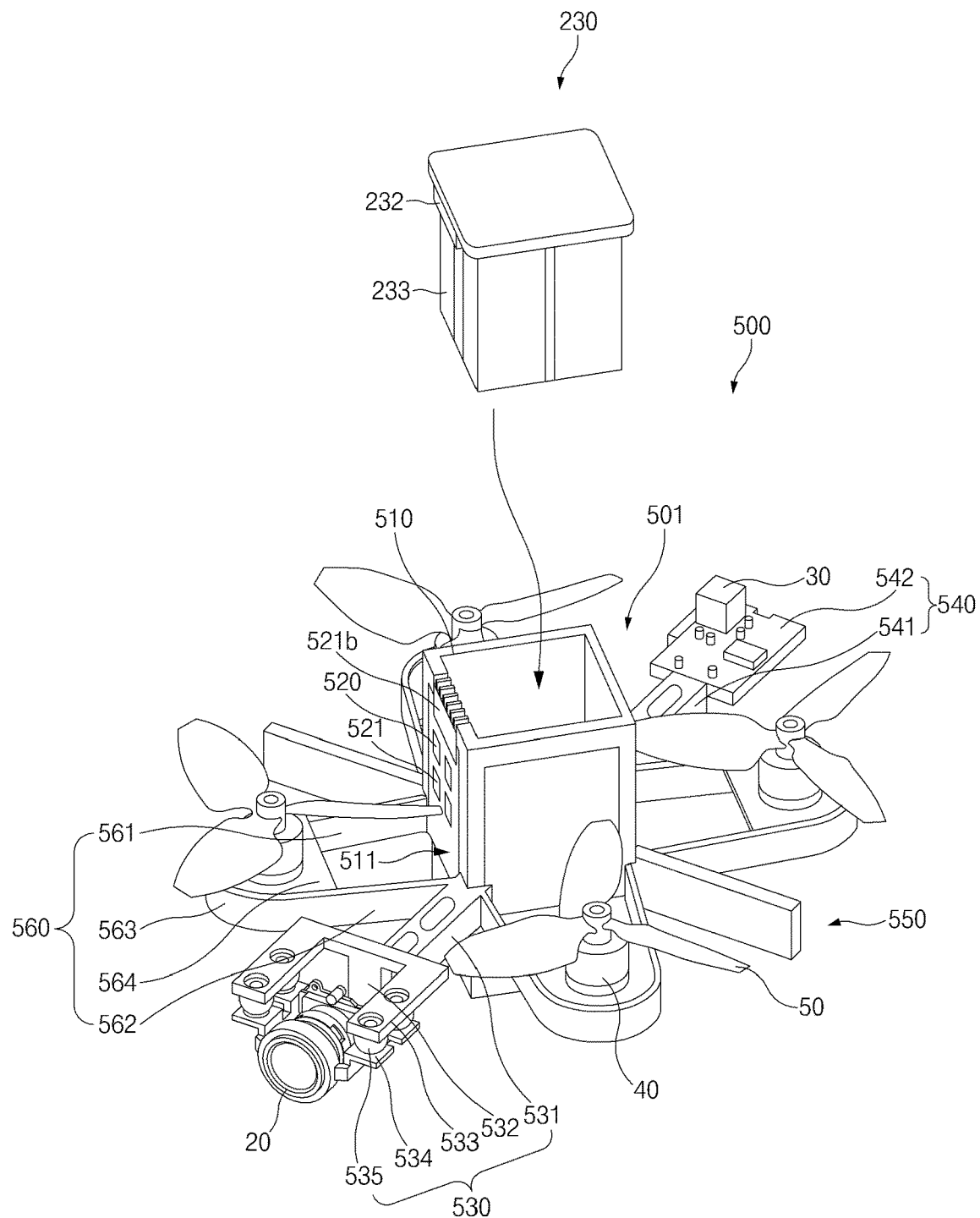
FIG. 5 is a diagram illustrating an example body according to an example embodiment of the present disclosure.

FIG. 5 is a diagram illustrating another example body according to an example embodiment of the present disclosure.

Referring to FIG. 5, an unmanned aerial vehicle 500 according to an embodiment of the present disclosure may include an integrated body 501, the camera 20, the sensor 30, the battery pack 230, the motors 40, and the propellers 50.

The camera 20, the sensor 30, the motors 40, and the propellers 50 mentioned above may be substantially the same as, or similar to, the camera, the sensor, the motors, and the propellers arranged on the body illustrated in FIG. 1.

The integrated body 501 according to an embodiment of the present disclosure may include a casing 510, a drive PCB 520, propeller supports 560, a camera support 530, a sensor support 540, and dummy supports 550. According to various embodiments, at least one drive PCB 520 may be disposed on at least one region of the outside and the inside of the casing 510, and a separate housing (e.g., the housing 110 of FIG. 1) may be configured to surround the casing 510 on which the drive PCB 520 is disposed. Accordingly, the drive PCB 520 may not be visible from the outside on account of the housing. Furthermore, the propeller supports 560, the camera support 530, the sensor support 540, and the dummy supports 550 may be disposed on outside walls of the casing 510. Hereinafter, a structure having no separate housing will be described with reference to FIG. 5.

The casing 510 according to an embodiment of the present disclosure may, for example, and without limitation, have a hollow polygonal (e.g., rectangular) prismatic shape. The battery pack 230 may be mounted in the casing 510. A connector 232 may be disposed on one side of the battery pack 230, as described above. The connector 232 may be electrically connected with a board contact 521b disposed on a side of the casing 510. The drive PCB 520 may be vertically arranged on outer surfaces (e.g., outside walls) of the casing 510. The drive PCB 520 may be similar to the above-described drive PCBs. According to an embodiment, a first PCB 521 may be attached or fixed to a first casing sidewall 511 of the casing 510. The board contact 521b, a motor power component, and the like may be disposed on the first PCB 521. The motor power component disposed on the first PCB 521 may directly receive electric power from the battery pack 230. The first PCB 521 may forward electric power supplied by the battery pack 230 to the motors 40 through the propeller supports 560. The above-described casing 510 may include the aforementioned form in which the housing and the casing are integrated with each other.

Each of the propeller supports 560 according to an embodiment of the present disclosure may horizontally extend from a side of the casing 510 (e.g., a lower surface of a sidewall of the casing 510). The motors 40 and the propellers 50 may be disposed on distal ends of the propeller supports 560, respectively. The propeller supports 560 may extend the same distance from four sidewalls of the casing 510. Each propeller support 560 may include a motor base 564, a base support 563, a first motor support 561, and a second motor support 562.

The camera support 530 according to an embodiment of the present disclosure may extend from one side of the casing 510 (e.g., one corner of the casing 510). The camera 20 may be disposed on a distal end of the camera support 530. The camera support 530 may include a camera support frame 531, a connecting frame 532, an upper frame 533, a lower frame 534, and dampers 535.

The sensor support 540 according to an embodiment of the present disclosure may extend from an opposite side of the casing 510 (e.g., an opposite corner of the casing 510). The sensor support 540 may be disposed symmetrical to the camera support 530 with respect to the center point of the casing 510. The sensor support 540 may include a sensor support frame 541 and a support plate 542.

The dummy supports 550 according to an embodiment of the present disclosure may extend a specific distance from corners of the casing 510 at which the camera support 530 and the sensor support 540 are not formed. The dummy supports 550 may be disposed to balance the camera support 530 and the sensor support 540.

As described above, the unmanned aerial vehicle 500 according to an embodiment of the present disclosure may provide the body 501 implemented with the single casing 510, as illustrated in FIG. 5, in addition to a form in which a casing and a housing are separated from each other. As mentioned above, in the structure in which the casing and the housing are separated from each other, a drive PCB may be disposed between an inside wall of the housing and an outside wall of the casing. For the integrated body 501, the drive PCB 520 may be fixed in a specified form to an outer surface of the casing 510. In this case, the drive PCB 520 may include support recesses formed to allow the above-described supports to extend and corresponding to the shape of the casing 510. Alternatively, the drive PCB 520 may have an inverted U-shaped lower part.

The top of the casing 510 may be open for insertion of the battery pack 230, whereas the bottom of the casing 510 may be open or closed depending on the shape of the drive PCB 520. In the case where the casing 510 is open at the bottom, the open bottom of the casing 510 may be closed by the drive PCB 520.

Figure 6:
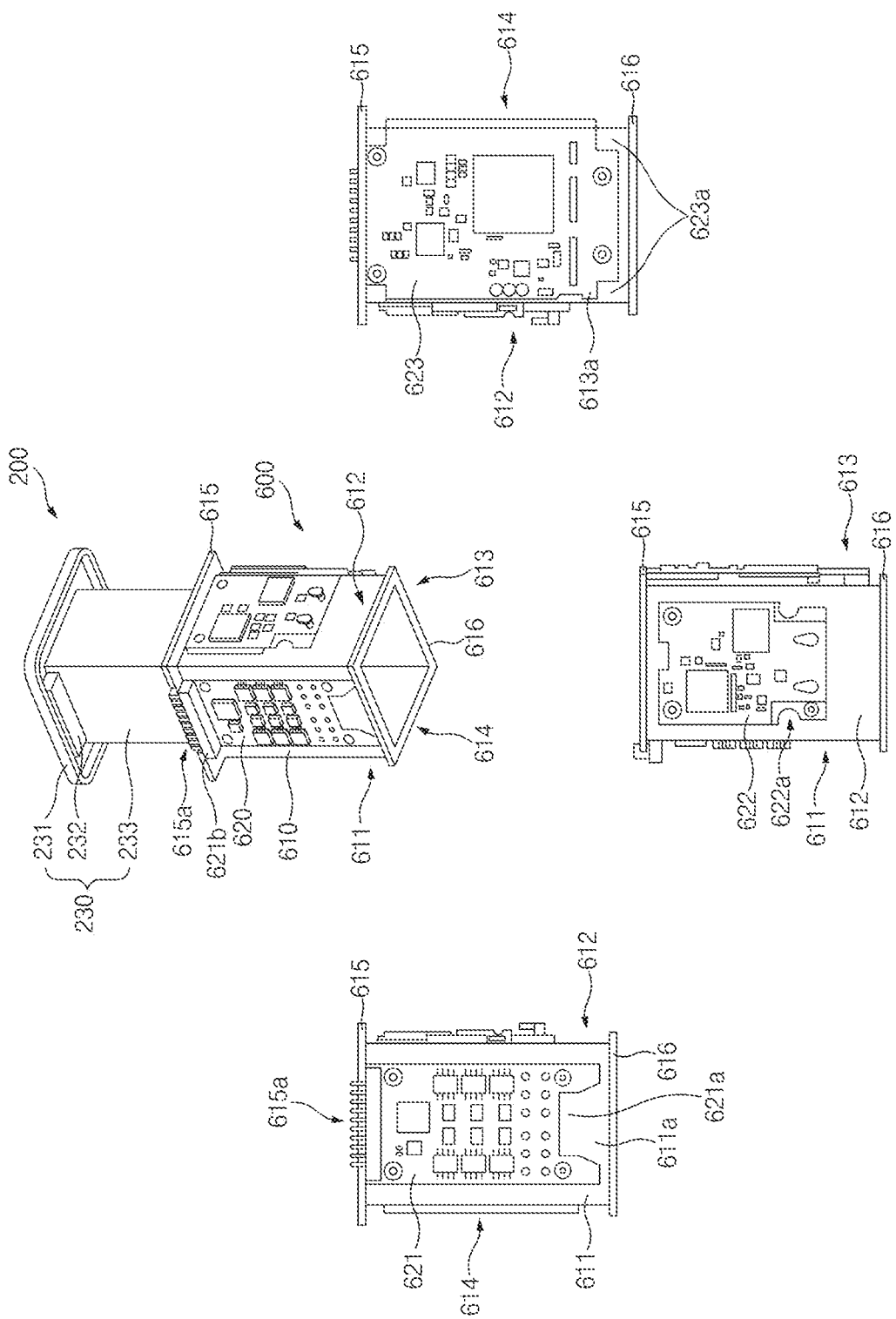
FIG. 6 is a diagram illustrating an example drive device according to an example embodiment of the present disclosure.
Figure 7:
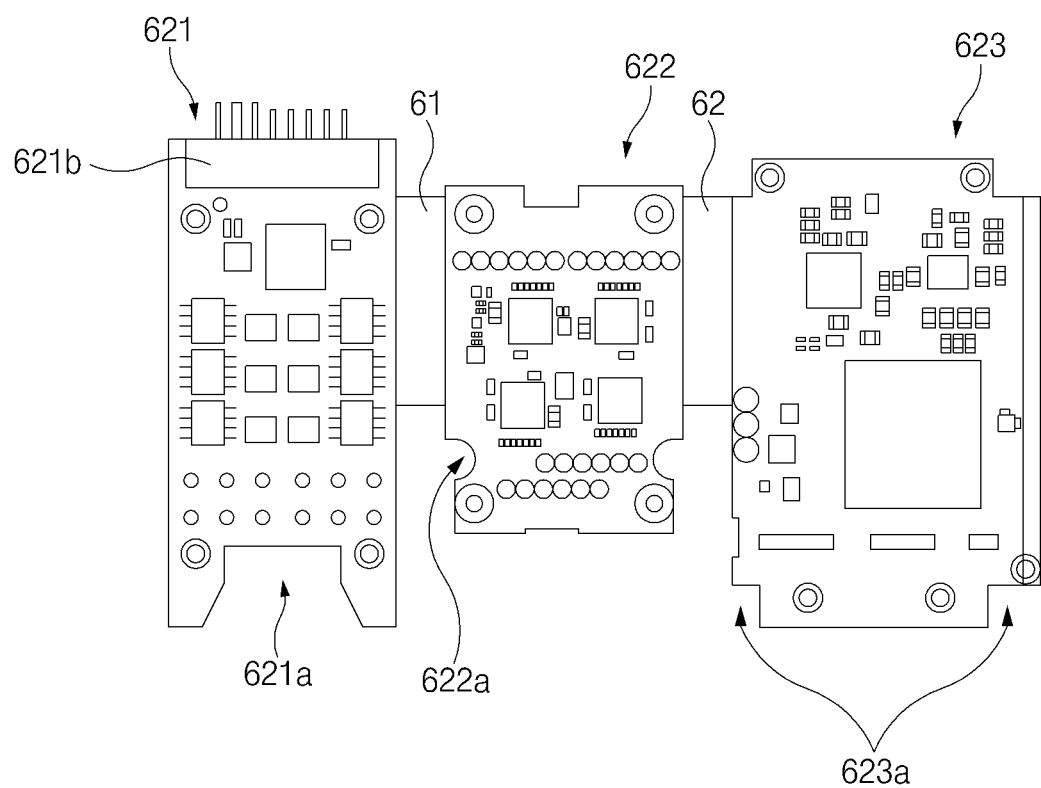
FIG. 7 is a diagram illustrating an example drive PCB according to an example embodiment of the present disclosure.

FIG. 6 is a diagram illustrating an example drive device according to an example embodiment of the present disclosure, and FIG. 7 is a diagram illustrating an example drive PCB according to an example embodiment of the present disclosure.

In FIG. 5, the drive device may include at least one of the casing and the housing mentioned above. The following description is made under the assumption that a propeller support, a camera support, a sensor support, and a dummy support are not formed on a casing.

Referring to FIGS. 6 and 7, a drive device 600 may include a casing 610 and a drive PCB 620.

The casing 610 (or a housing) according to an embodiment of the present disclosure may have a hollow polygonal prismatic shape. The battery pack 230 may be mounted in the casing 610. The connector 232 may be disposed on one side of the battery pack 230, as described above. The connector 232 may be electrically connected with a board contact 621b disposed on a side of the casing 610. The drive PCB 620 may be vertically arranged on outer surfaces (e.g., outside walls) of the casing 610.

According to various embodiments, the casing 610 may have a rectangular prismatic shape and therefore may include a first casing sidewall 611, a second casing sidewall 612, a third casing sidewall 613, and a fourth casing sidewall 614. An inner space defined by the casing sidewalls 611 to 614 may be used as a space for receiving the battery pack 230. A coupling means (e.g., a boss having internal female threads formed therein) for fixing the drive PCB 620 may be disposed on at least one of the casing sidewalls 611 to 614. The top of the casing 610 may be open such that the battery pack 230 is inserted into the casing 610 through the open top. The bottom of the casing 610 may be open, or may be closed according to a design change. The casing 610 may have a first flange 615 around the open top thereof and a second flange 616 around the open bottom thereof. The first flange 615 may be inserted into a cover part 231 formed on the battery pack 230. A contact groove 615a may be disposed on a side of the first flange 615. When the battery pack 230 is inserted into the casing 610, the connector 232 formed on the battery pack 230 may make electrical contact with the contact groove 615a. In this operation, the contact groove 615a and the connector 232 may be firmly maintained in the contact state by the gravitational force acting on the battery pack 230 or the elastic force of connector terminals. In a housing structure (or the housing 110) that surrounds the casing 610, the second flange 616 may be inserted into the housing 110 illustrated in FIGS. 1 and 2 to form a specific separation distance between the casing sidewalls 611 to 614 of the casing 610 and the inside walls of the housing 110. Accordingly, the second flange 616 may serve to maintain the separation distance so as to prevent and/or reduce the drive PCB 620 disposed on the casing sidewalls 611 to 614 from making contact with the inside walls of the housing 110.

The drive PCB 620 according to an embodiment of the present disclosure may include, for example, a first PCB 621, a second PCB 622, a third PCB 623, a first connecting PCB 61, and a second connecting PCB 62. At least one of the PCBs 621, 622, and 623 may have at least one hole formed therein, which is aligned with the coupling means on the casing 610 such that the drive PCB 620 is coupled by a fastening means (e.g., a screw). The drive PCB 620, which is disposed on at least one of the casing sidewalls 611 to 614, may be disposed on the casing sidewalls 611 to 614 vertically arranged based on the arrangement of the propellers 50 of the unmanned aerial vehicle 10 or the plane of rotation of the propellers 50. Accordingly, the drive PCB 620 may be vertically arranged based on the arrangement of the propellers 50. The first connecting PCB 61 may electrically connect, for example, the first PCB 621 and the second PCB 622 and may transfer, to the second PCB 622, control signals generated by at least some elements (e.g., a control IC) mounted on the first PCB 621. The second connecting PCB 62 may electrically connect the second PCB 622 and the third PCB 623 and may transfer, to the third PCB 623, control signals generated by some elements mounted on at least one of the first PCB 621 and the second PCB 622.

A processor or a motor control circuit (or a motor power component) (e.g., including a power circuit) that relates to operating control of the unmanned aerial vehicle 10 may be disposed on the first PCB 621 according to an embodiment of the present disclosure. At least part of the first PCB 621 may be of a rigid type (or a type having a specified strength or hardness). At least one processor or camera control circuit may be disposed on the second PCB 622. At least part of the second PCB 622 may be of a rigid type. At least one processor or sensor control circuit may be disposed on the third PCB 623. At least part of the third PCB 623 may be of a rigid type. The first connecting PCB 61 may include at least one interconnection wire electrically connecting at least some elements of the first PCB 621 and the second PCB 622. For example, the first connecting PCB 61 may be of a flexible type. The second connecting PCB 62 may include at least one interconnection wire electrically connecting at least some elements of the second PCB 622 and the third PCB 623. For example, the second connecting PCB 62 may be of a flexible type.

Although, the motor control circuit is illustrated as being disposed on the first PCB 621, the camera control circuit is illustrated as being disposed on the second PCB 622, and the sensor control circuit is illustrated as being disposed on the third PCB 623, the present disclosure is not limited thereto. According to an embodiment, the motor control circuit may consume a larger amount of electric power. Accordingly, to shorten the connection path to the battery pack 230, the PCB having the motor control circuit mounted thereon may be disposed on a sidewall on which the contact groove 615a is located in the same plane as the position of the first flange 615. According to an embodiment, the first PCB 621 may include a PCB on which the contact groove 615a connected with the connector 232 of the battery pack 230 is disposed.

At least one of the above-described PCBs 621, 622, and 623 according to an embodiment of the present disclosure may include a portion corresponding to a recess formed on the casing sidewalls 611 to 614. For example, the first PCB 621 may include leads protruding from opposite sides of a lower end thereof and an upwardly-recessed depression 621a located in the middle of the lower end thereof. The first casing sidewall 611 may include a first protrusion 611a that has a shape corresponding to the depression 621a and faces the depression 621a. The second PCB 622 may include inwardly-depressed mounting recesses 622a on opposite lateral sides thereof. The second casing sidewall 612 may include second protrusions 612a protruding in a shape corresponding to the mounting recesses 622a. The third PCB 623 may include inwardly-depressed arrangement recesses 623a on opposite sides of a lower portion thereof. The third casing sidewall 613 may include third protrusions 613a protruding in a shape corresponding to the arrangement recesses 623a.

The battery pack 230 according to an embodiment of the present disclosure may include, for example, a rectangular prismatic part 233 having a rectangular cross-section and a specific height and the cover part 231 disposed on an upper end of the prismatic part 233 and coupled with the first flange 615 of the casing 610. The upper surface of the cover part 231 may be flat, and the lower surface of the cover part 231 may be disposed on the upper end of the prismatic part 233 and may have a shape in which edge portions further protrude beyond inner portions adjacent thereto. Accordingly, the cover part 231 may have a rail groove formed between the edge portions on the lower surface thereof and the prismatic part 233. The first flange 615 may be mounted in the rail groove. The connector 232, which is inserted into the contact groove 615a disposed on a side of the casing 610 or is electrically connected with the board contact 621b inserted into the contact groove 615a, may be disposed on a lower side of the cover part 231.

In the above-described drive device 600 of the unmanned aerial vehicle 10, the contact groove 615a and the lower portion of the receiving space for the battery pack 230 may be open, and the PCBs 621, 622, and 623 may be arranged on the casing 610 around the Z-axis, which makes it possible to make the unmanned aerial vehicle 10 compact. According to various embodiments, the motor power component consuming a large amount of electric power may be disposed on a PCB including a board contact, which makes it possible to shorten a power path and to effectively share a ground layer with a battery. A motor control signal may be generated by another PCB and may be transferred to the motor power component through a connecting PCB.

Figure 8:
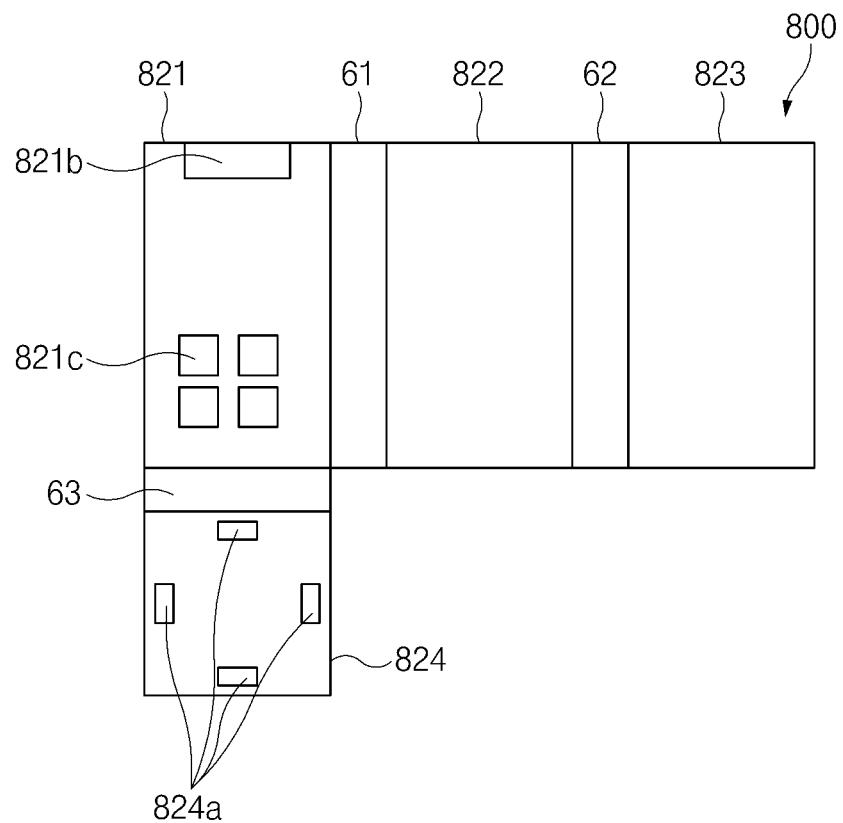
FIG. 8 is a diagram illustrating another example drive PCB of an unmanned aerial vehicle according to an example embodiment of the present disclosure.

FIG. 8 is a diagram illustrating another example drive PCB of an unmanned aerial vehicle according to an example embodiment of the present disclosure.

Referring to FIG. 8, a drive PCB 800 according to another embodiment of the present disclosure may include a first PCB 821, a second PCB 822, a third PCB 823, and a fourth PCB 824 and may further include a first connecting PCB 61, a second connecting PCB 62, and a third connecting PCB 63.

The first PCB 821 according to an embodiment of the present disclosure may be, for example, a PCB having a motor power component (e.g., a drive module or a motor control circuit that relates to driving the motors 40) disposed thereon. In this regard, the first PCB 821 may include a board contact 821b to be connected with the connector 232 of the battery pack 230. The board contact 821b may be directly connected to a contact groove and may directly forward, to a motor control circuit, electric power from the battery pack 230 directly connected to the contact groove. As described above, while forwarding the electric power from the battery pack 230 to the motors 40, the first PCB 821 may minimize and/or reduce a path therein to minimize and/or reduce power consumption, thereby efficiently processing power supply to the motors 40. The first PCB 821 may shorten the path between the battery pack 230 and the motor power component and may effectively share a ground layer with the battery pack 230.

The second PCB 822 according to an embodiment of the present disclosure may be disposed on a side (e.g., the right side) of the first PCB 821 and may be electrically connected with the first PCB 821 through the first connecting PCB 61. For example, at least one processor relating to control of the unmanned aerial vehicle 10 may be mounted on the second PCB 822. Alternatively, a communication processor and a communication circuit may be mounted on the second PCB 822.

The third PCB 823 according to an embodiment of the present disclosure may be disposed on a side (e.g., the right side) of the second PCB 822 and may be electrically connected with the second PCB 822 through the second connecting PCB 62. For example, at least one processor relating to control of the unmanned aerial vehicle 10 may be mounted on the third PCB 823. Alternatively, a control circuit relating to control of the sensor 30, a control circuit relating to control of the camera 20, a memory, or the like may be mounted on the third PCB 823. The above-described first to third PCBs 821 to 823 may be disposed on sidewalls of a casing.

The fourth PCB 824 according to an embodiment of the present disclosure may be disposed on a side (e.g., the lower side) of the first PCB 821 and may be electrically connected with the first PCB 821 through the third connecting PCB 63. For example, at least one processor relating to control of the unmanned aerial vehicle 10 may be mounted on the fourth PCB 824. Alternatively, motor contacts 824a may be mounted on the fourth PCB 824. The motor contacts 824a may include contact points electrically connected with the motors 40 coupled with the propellers 50. The motor contacts 824a may include contact points to which at least one of electric power relating to operating the motors 40 and a control signal relating to controlling the motors 40 is supplied. The motor power component (or the motor control circuit) disposed on the first PCB 821 may be electrically connected with the motor contacts 824a through the third PCB 63. For example, the fourth PCB 824 may be disposed on a side of the bottom of the casing 810 (e.g., the lower outer surface of the casing 810).

As described above, the first PCB 821 having a circuit component consuming the largest amount of electric power may be directly connected with the battery pack 230. According to various embodiments, a PCB having a circuit component consuming a larger amount of electric power may be disposed closer to the first PCB 821 than the other PCBs.

Power supply control through the board contact 821b, according to an embodiment of the present disclosure, may be performed by motor power components 821c or a motor control circuit (or a power management circuit) mounted on the first PCB 821. According to various embodiments, the motor power components 821 may also be mounted on the fourth PCB 824. Since the motor contacts 824a are disposed on the periphery of the rear surface of the fourth PCB 824, the motor contacts 824a may maintain the same distance from the motors 40 disposed at the same distance in directions perpendicular to the respective sidewalls of the casing 810 or the housing.

Figure 9:
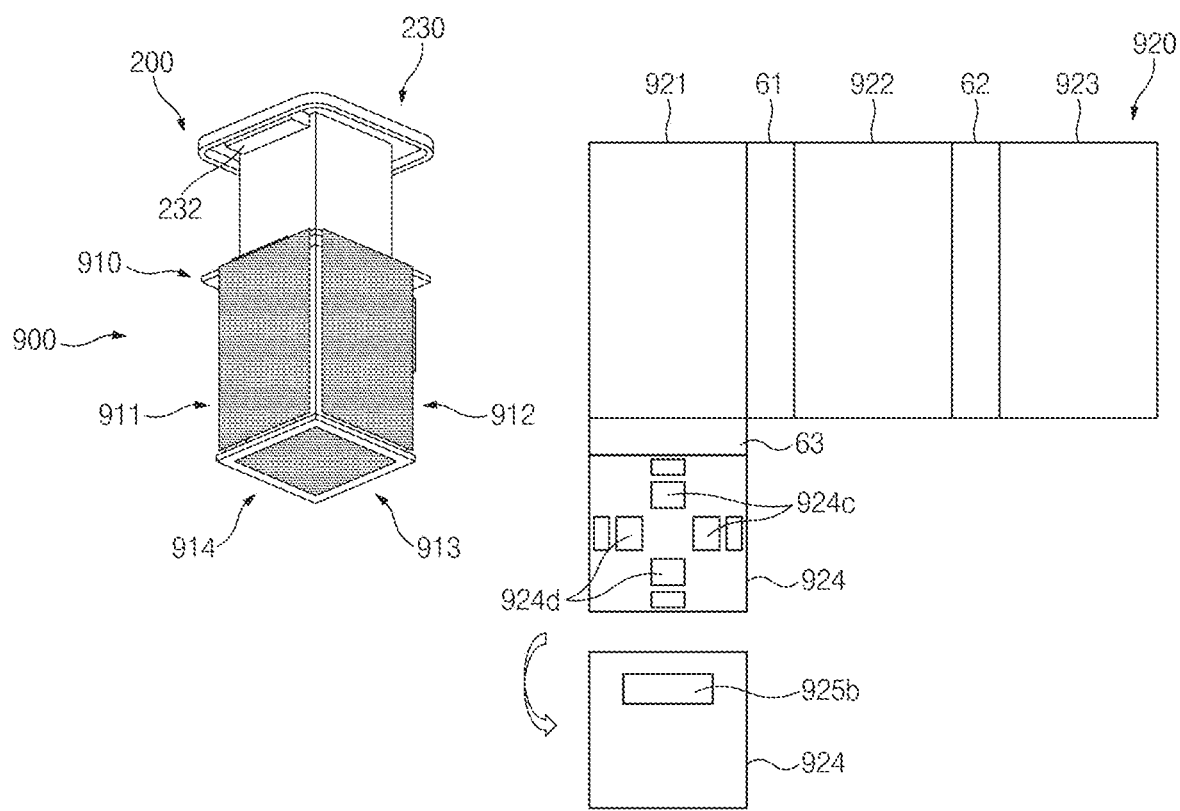
FIG. 9 is a diagram illustrating another example drive PCB according to an example embodiment of the present disclosure.

FIG. 9 is a diagram illustrating another example drive PCB according to an example embodiment of the present disclosure.

Referring to FIG. 9, a drive device 900 according to an embodiment of the present disclosure may include the battery pack 230, a casing 910, and a drive PCB 920.

The drive PCB 920 according to an embodiment of the present disclosure may include a first PCB 921, a second PCB 922, a third PCB 923, and a fourth PCB 924 and may further include the first connecting PCB 61, the second connecting PCB 62, and the third connecting PCB 63.

The first PCB 921 according to an embodiment of the present disclosure may be disposed on and fixed to, for example, a first casing sidewall 911. The second PCB 922 may be connected to one side (e.g., the right side) of the first PCB 921 through the first connecting PCB 61. The second PCB 922 may be disposed on, for example, a second casing sidewall 912. The third PCB 923 may be connected to one side (e.g., the right side) of the second PCB 922 through the second connecting PCB 62. The third PCB 923 may be disposed on, for example, a third casing sidewall 913. The fourth PCB 924 may be connected to one side (e.g., the lower side) of the first PCB 921 through the third connecting PCB 63. For example, motor power components 924d (or a motor control circuit) and motor contacts 924c may be mounted on the fourth PCB 924. A board contact 925b to be connected with the battery pack 230 may be mounted on the rear surface of the fourth PCB 924. The board contact 925b may be electrically connected with a connector disposed on the bottom of the battery pack 230.

The casing 910 according to an embodiment of the present disclosure may have a shape with a hollow interior extending through the top and bottom thereof for electrical connection between the battery pack 230 and the fourth PCB 924. A fixing part for fixing the fourth PCB 924 may be disposed around the open bottom of the casing 910.

As described above, the drive device 900 according to an embodiment of the present disclosure may efficiently forward electric power from the battery pack 230 to the motors 40 by disposing the drive PCB 920 using the plurality of sidewalls or the bottom of the casing 910 and minimizing and/or reducing paths between a power supply of the battery pack 230 and the motor power components 924d.

According to various embodiments, although electric power is illustrated as being supplied to the fourth PCB 924 through the board contact 925b, the present disclosure is not limited thereto. For example, a contact (or the connector 232) through which electric power is to be supplied may be disposed on a side of an upper portion of the battery pack 230. Accordingly, when the battery pack 230 is inserted into the casing 910 and makes contact with the bottom of the casing 910, the battery pack 230 and the contact (or the connector 232) disposed on a side of the casing 910 may be electrically connected with each other. Power supply control through the board contact 925b may be performed by the motor power components 924d or the motor control circuit (or the power management circuit) mounted on the first PCB 921. According to various embodiments, the motor power components 924d may be mounted on the fourth PCB 924 (may be mounted on the outside of the fourth PCB 924 disposed on the casing 910). Since the motor contacts 924c are disposed on the periphery of the rear surface of the fourth PCB 924, the motor contacts 924c may maintain the same distance from the motors 40 disposed at the same distance in directions perpendicular to the respective sidewalls of the casing 910 or the housing.

According to various example embodiments, an unmanned aerial vehicle may be provided. The unmanned aerial vehicle may include a housing including an outer surface, an opening formed in the outer surface, and an inner structure disposed inside the housing, the inner structure including an inner surface and an outer surface that define an inner space, wherein the opening and the inner space are at least partially aligned with each other in a first direction, a battery mounted in the inner space, wherein the battery is configured to slide into the inner space through the opening, at least one propeller mounted on the housing or connected to the housing, the at least one propeller being connected to the housing and configured to rotate about an axis extending in the first direction, at least one motor configured to operate the at least one propeller, at least one printed circuit board (PCB) mounted on the outer surface of the inner structure, the at least one PCB arranged to be substantially perpendicular to the first direction, and a power management circuit mounted on the at least one PCB and electrically connected with the battery and the at least one motor.

According to various example embodiments, the inner structure may include a first sidewall located in a second direction perpendicular to the first direction, wherein the at least one PCB includes a first PCB mounted on an outer surface of the first sidewall, wherein the power management circuit is mounted on the first PCB, wherein the battery includes at least one electrical contact point, wherein the first sidewall includes at least one electrical contact point adjacent to the opening, and wherein the at least one electrical contact point of the first sidewall is configured to be electrically connected with the power management circuit and is located to provide contact with the at least one electrical contact point of the battery when the battery is inserted into the inner space.

According to various example embodiments, the inner structure may further include a second sidewall located in a third direction perpendicular to the first direction and the second direction, and wherein the at least one PCB further includes a second PCB mounted on an outer surface of the second sidewall.

According to various example embodiments, the second PCB may be connected with the first PCB through a flexible PCB.

According to various example embodiments, the inner structure may further include a third sidewall opposite to the first sidewall, and wherein the at least one PCB further includes a third PCB mounted on an outer surface of the third sidewall.

According to various example embodiments, the third PCB may be connected with the second PCB through a flexible PCB.

According to various example embodiments, the unmanned aerial vehicle may further include at least one processor and/or a sensor mounted on the third PCB.

According to various example embodiments, the inner structure, when viewed from above the opening, may be arranged so as not to overlap an operating range of the at least one propeller.

According to various example embodiments, an unmanned aerial vehicle may include a housing arranged in a first direction, the housing including at least four housing sidewalls and an opening defined by the housing sidewalls, the opening configured to receive (or formed to receive) a battery pack, a propeller support part extending a specific distance from each housing sidewall in a second direction away from the center of the housing and perpendicular to the first direction, the propeller support having, on a distal end, a motor and a propeller connected to the motor, and a PCB disposed on at least one of the housing sidewalls, the PCB being associated with operating the motor and the propeller.

According to various example embodiments, the PCB may include a first PCB on which a power management circuit associated with operating the motor is mounted, the first PCB being directly connected to the battery pack when the battery pack is inserted into the housing.

According to various example embodiments, the unmanned aerial vehicle may further include a camera configured to take an image, wherein the PCB further includes a second PCB on which a control circuit associated with operating the camera is mounted, the second PCB being disposed on a housing sidewall adjacent to the first PCB, and a flexible PCB configured to electrically connect the first PCB and the second PCB.

According to various example embodiments, the unmanned aerial vehicle may further include a third PCB disposed on the bottom of the housing and including electrical contact points electrically connected with the motor; and a flexible PCB electrically connected with the first PCB and the third PCB.

According to various example embodiments, the battery pack is configured to be inserted into the housing through the opening of the housing, and wherein the battery pack includes a prismatic part mounted in the housing, a cover disposed on an upper end of the prismatic part and coupled with upper ends of the housing sidewalls that define the opening of the housing, and a connector electrically connected with the PCB.

According to various example embodiments, the housing sidewalls may include a contact groove configured to electrically connect at least part of the PCB and the connector, and wherein the PCB includes a board contact disposed in the contact groove and electrically connected with the connector.

According to various example embodiments, the housing sidewalls may include at least one fixation recess for fixing the PCB.

According to various example embodiments, the unmanned aerial vehicle may further include a camera support extending a specific distance from a first corner formed by the housing sidewalls in a third direction away from the center of the housing and perpendicular to the first direction, the camera support having a camera disposed on a distal end of the camera support.

According to various example embodiments, the unmanned aerial vehicle may further include a sensor support extending a specific distance from a second corner formed by the housing sidewalls in a fourth direction that is away from the center of the housing and is perpendicular to the first direction and opposite to the third direction, the sensor support having a sensor disposed on a distal end of the sensor support.

According to various example embodiments, the unmanned aerial vehicle may further include at least one dummy support extending from corners of the housing at which the camera support and the sensor support are not disposed, in a direction away from the center of the housing and perpendicular to the first direction while forming a specific angle with the third or fourth direction on a horizontal plane.

According to various example embodiments, the unmanned aerial vehicle may further include a protective structure configured to surround the housing and the propeller support part.

According to various example embodiments, an unmanned aerial vehicle may include a battery pack, a casing arranged in a first direction and including at least four casing sidewalls and an opening defined by the casing sidewalls, the opening being configured to receive (or formed to receive) the battery pack, a housing into which the casing is inserted, a PCB disposed on at least one of sidewalls of the housing, a motor configured to operate under control of the PCB, a propeller connected to the motor, a camera configured to take an image under control of the PCB, a sensor configured to perform a specified sensing operation under control of the PCB, and a mesh-type protective structure configured to fix the housing and the motor and to surround the housing and the propeller.

Figure 10:
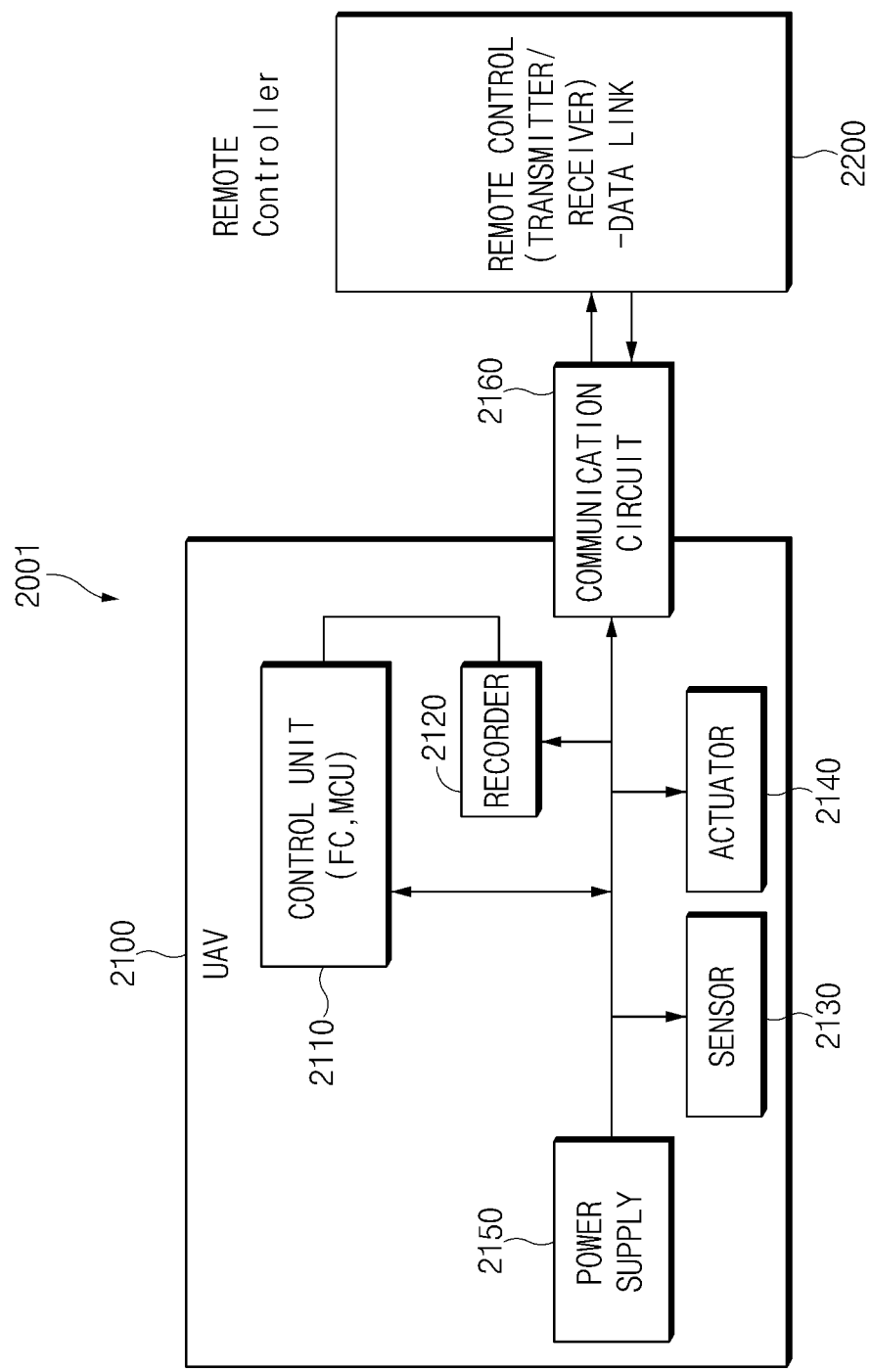
FIG. 10 is a block diagram illustrating an example unmanned aerial vehicle and a remote controller according to an example embodiment of the present disclosure.

FIG. 10 is a block diagram illustrating an example unmanned aerial vehicle and a remote controller according to an example embodiment of the present disclosure.

Referring to FIG. 10, an unmanned aerial vehicle 2001 according to an embodiment of the present disclosure may include a body 2100, a control unit (e.g., including processing circuitry) 2110, a power supply 2150, a sensor 2130, an actuator 2140, a communication circuit (e.g., including communication circuitry) 2160, and a recorder (e.g., including recording circuitry) 2120. As described above, the body 2100 may include a housing in which a drive device (e.g., a PCB having the control unit 2110, the power supply 2150, and the communication circuit 2160 mounted thereon) is mounted and a support for fixing the actuator 2140 or the sensor 2130. The power supply 2150 may include, for example, the above-described battery of battery pack. The sensor 2130 may include the above-described sensor 30, the actuator 2140 may include the above-described motors 40, and the recorder 2120 may include, for example, the camera 20 and a memory device for storing images obtained by the camera 20.

The remote controller 2200 according to an embodiment of the present disclosure may include a communication unit (e.g., communication circuitry) for communicating with the unmanned aerial vehicle 2001, an input unit (e.g., including input circuitry) for controlling a change of the direction of the unmanned aerial vehicle 2001 upwards, downwards, leftwards, rightwards, forwards, or backwards, and a control unit for controlling a camera mounted on the unmanned aerial vehicle 2001. In this regard, the remote controller 2200 may include a communication circuit, a joystick, a touch panel, or the like. Additionally, the remote controller 2200 may include a display for outputting images taken by the unmanned aerial vehicle 2001 in real time.

Figure 11:
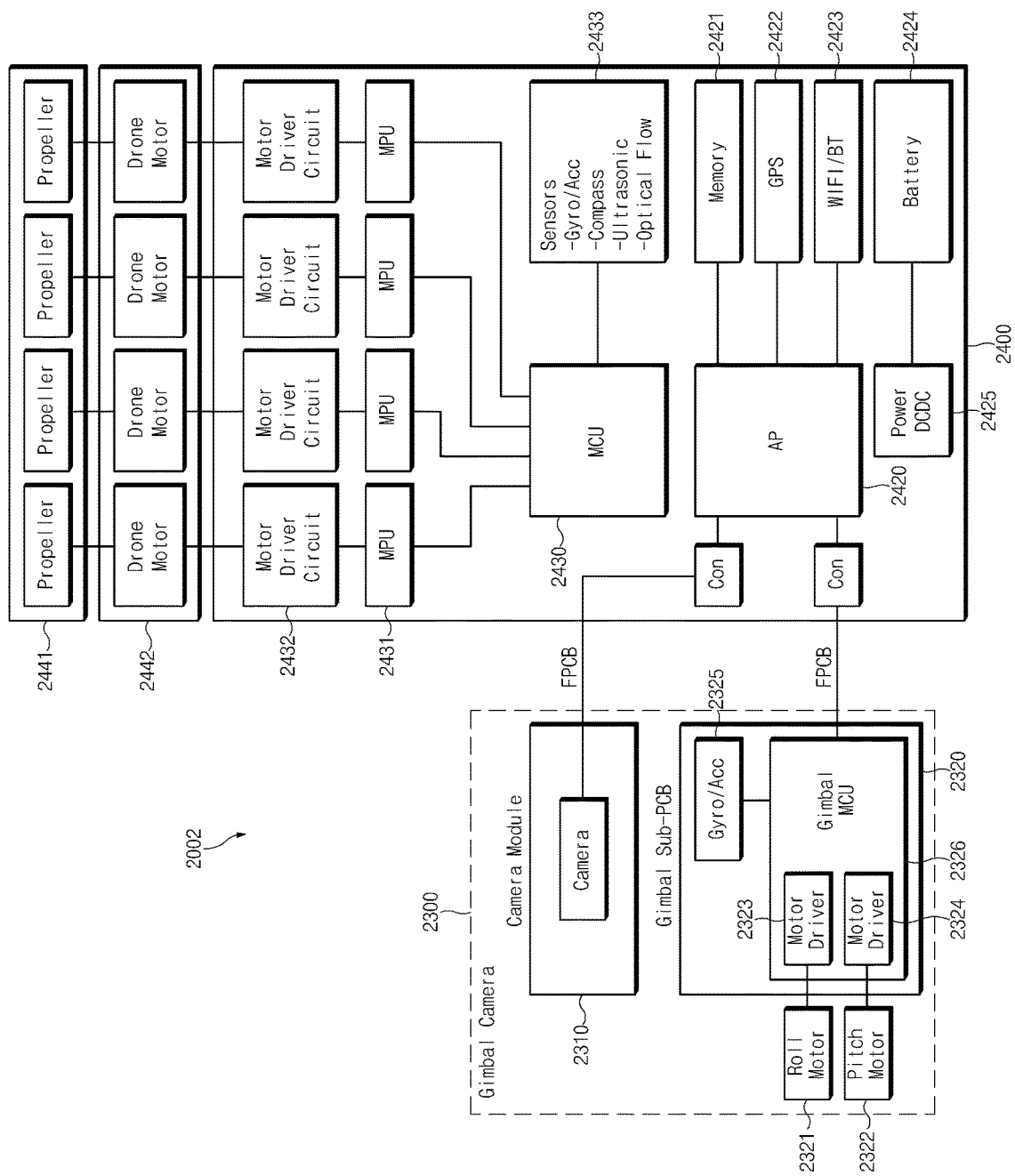
FIG. 11 is a block diagram illustrating an example unmanned aerial vehicle according to various example embodiments of the present disclosure.

FIG. 11 is a block diagram illustrating an example unmanned aerial vehicle according to various example embodiments of the present disclosure.

Referring to FIG. 11, an unmanned aerial vehicle 2002 according to an example embodiment of the present disclosure may include a gimbal camera device 2300, a drive device 2400, a plurality of propellers 2441, and a plurality of motors 2442.

The gimbal camera device 2300 according to an embodiment of the present disclosure may include, for example, a camera module (e.g., including a camera 2310a gimbal sub-PCB 2320, a roll motor 2321, and a pitch motor 2322. The gimbal sub-PCB 2320 may include a gyro sensor and an acceleration sensor 2325 and a gimbal motor control circuit 2326, and the gimbal motor control circuit 2326 may include a first motor driver 2323 for controlling the roll motor 2321 and a second motor driver 2324 for controlling the pitch motor 2322.

The drive device 2400 according to an embodiment of the present disclosure may include an application processor (e.g., including processing circuitry) 2420 and a main motor control circuit 2430. Furthermore, the drive device 2400 may include a memory 2421, a position information collecting sensor 2422 (e.g., a GPS), and a communication circuit 2423 (e.g., Wi-Fi or BT) that are controlled by the application processor 2420.

The drive device 2400 according to an embodiment of the present disclosure may include at least one sensor 2433 controlled by the main motor control circuit 2430, a plurality of motor driver circuits 2432 for controlling the plurality of motors 2422, and a plurality of sub-motor control circuits 2431 for controlling the plurality of motor driver circuits 2432. The drive device 2400 may include a battery 2424 and a power control unit 2425.

Figure 12:
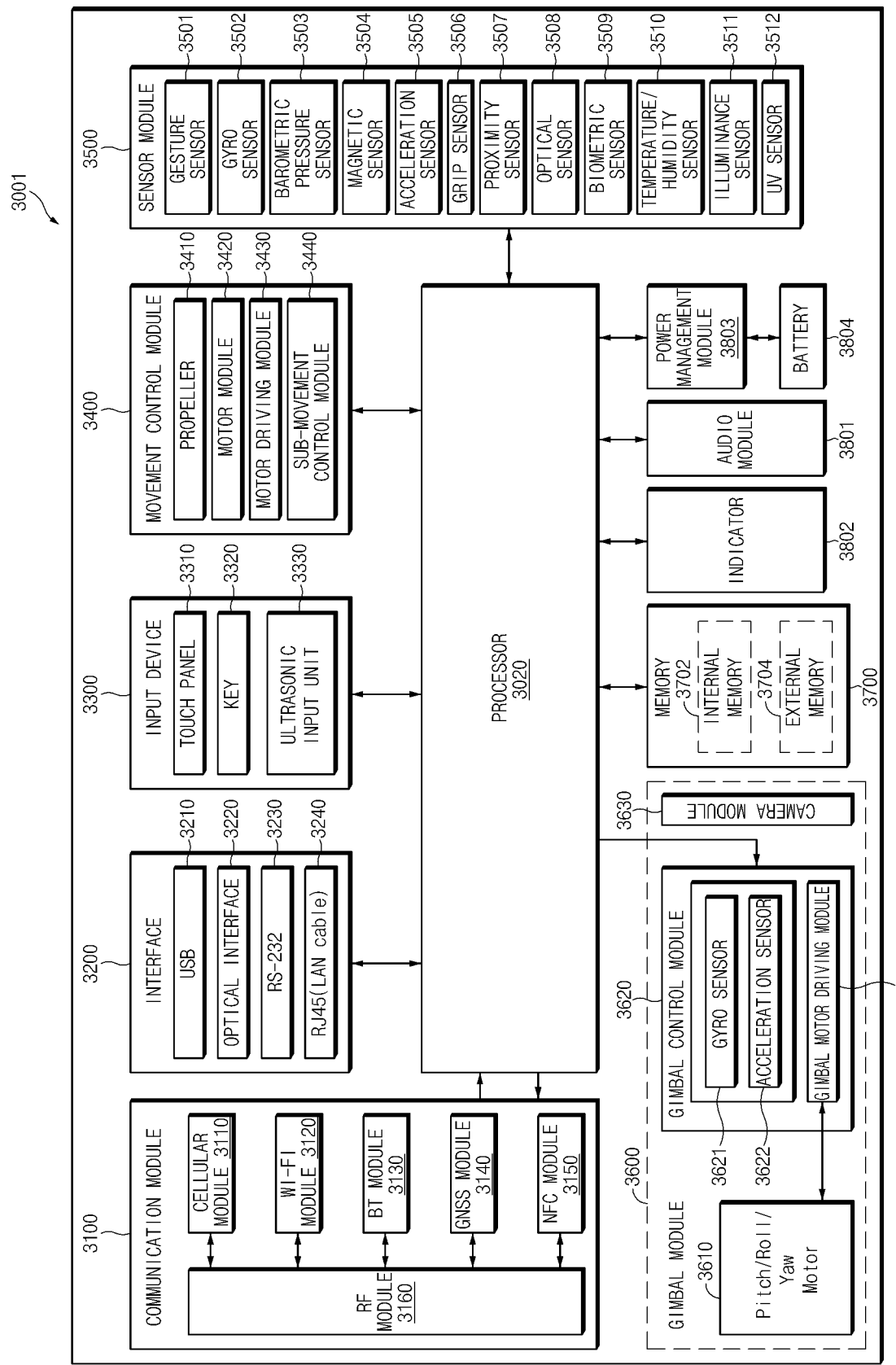
FIG. 12 is a diagram illustrating another example unmanned aerial vehicle according to various example embodiments of the present disclosure.

The gimbal camera device 2300 and the drive device 2400, according to an embodiment of the present disclosure, may be connected together through a flexible printed circuit board (FPCB) or a conducting wire FIG. 12 is a block diagram another example unmanned aerial vehicle according to various example embodiments of the present disclosure.

Referring to FIG. 12, an unmanned aerial vehicle 3001 may include at least one processor (e.g., including processing circuitry) 3020 (e.g., an AP), a communication module (e.g., including communication circuitry) 3100, an interface (e.g., including interface circuitry) 3200, an input device (e.g., including input circuitry) 3300, a sensor module 3500, a memory 3700, an audio module 3801, an indicator 3802, a power management module 3803 (or a power management circuitry), a battery 3804, a camera module 3630, and a movement control module (e.g., including movement control circuitry) 3400, and may further include a gimbal module (e.g., including gimbal circuitry) 3600.

The processor 3020 according to an embodiment of the present disclosure may include various processing circuitry and drive, for example, an operating system or application programs to control a plurality of hardware or software elements connected to the processor 3020 and to process and compute a variety of data. The processor 3020 may generate flight commands of the unmanned aerial vehicle 3001 by driving the operating system or an application program. For example, the processor 3020 may generate a movement command by using data received from the camera module 3630, the sensor module 3500, or the communication module 3100. The processor 3020 may generate a movement command by computing a relative distance of an obtained subject, may generate an altitude movement command of an unmanned photographing device with the vertical coordinate of the subject, and may generate a horizontal and azimuth angle command of the unmanned photographing device with the horizontal coordinate of the subject.

The communication module 3100 according to an embodiment of the present disclosure may include various communication circuitry, such as, for example, and without limitation, one or more of a cellular module 3110, a Wi-Fi module 3120, a Bluetooth module 3130, a global navigation satellite system (GNSS) module 3140, an NFC module 3150, and an RF module 3160. The communication module 3100 according to various embodiments of the present disclosure may receive a control signal for the unmanned aerial vehicle 3001 and may transmit status information of the unmanned aerial vehicle 3001 and image data information to another electronic device. The RF module 3160 may transmit and receive a communication signal (e.g., an RF signal). The RF module 3160 may include, for example, a transceiver, a power amplifier module (PAM), a frequency filter, a low noise amplifier (LNA), an antenna, or the like. The GNSS module 3140 may output position information, such as latitude, longitude, altitude, GPS speed, GPS heading, and the like, while the unmanned aerial vehicle 3001 moves. The position information may be computed by measuring accurate time and distance through the GNSS module 3140. The GNSS module 3140 may also obtain accurate time together with three-dimensional speed information, as well as latitude, longitude, and altitude. The unmanned aerial vehicle 3001 according to an embodiment may transmit information for checking a real-time moving state of the unmanned photographing device to an external electronic device (e.g., a portable terminal capable of communicating with the unmanned aerial vehicle 3001) through the communication module 3100.

The interface 3200 according to an embodiment of the present disclosure may include various interface circuitry for input/output of data with another electronic device. The interface 3200 may forward commands or data input from another external device to other element(s) of the unmanned aerial vehicle 3001 by using various interface circuitry, such as, for example, and without limitation, one or more of a USB 3210, an optical interface 3220, an RS-232 3230, or an RJ45 3240. The interface 3200 may output commands or data received from the other element(s) of the unmanned aerial vehicle 3001 to a user or the other external device.

The input device 3300 according to an embodiment of the present disclosure may include various input circuitry, such as, for example, and without limitation, one or more of a touch panel 3310, a key 3320, and an ultrasonic input device 3330. The touch panel 3310 may use at least one of, for example, capacitive, resistive, infrared and ultrasonic detecting methods. Also, the touch panel 3310 may further include a control circuit. The key 3320 may include, for example, a physical button, an optical key, or a keypad. The ultrasonic input device 3330 may sense ultrasonic waves, which are generated from an input device, through a microphone and may check data corresponding to the sensed ultrasonic waves. A control input of the unmanned aerial vehicle 3001 may be received through the input device 3300. For example, if a physical power key is pressed, the power supply of the unmanned aerial vehicle 3001 may be shut off.

The sensor module 3500 according to an embodiment of the present disclosure may include, for example, and without limitation, some or all of a gesture sensor 3501 for sensing a motion and/or gesture of a subject, a gyro sensor 3502 for measuring the angular velocity of an unmanned photographing device in flight, a barometric pressure sensor 3503 for measuring an atmospheric pressure change and/or atmospheric pressure, a magnetic sensor 3504 (a terrestrial magnetism sensor or a compass sensor) for measuring the Earth's magnetic field, an acceleration sensor 3505 for measuring the acceleration of the unmanned aerial vehicle 3001 in flight, a grip sensor 3506 for determining a grip state of an object or whether an object is held or not, a proximity sensor 3507 for measuring distance (including an ultrasonic sensor for measuring distance by outputting ultrasonic waves and measuring signals reflected from an object), an optical sensor 3508 (an optical flow sensor (OFS)) for calculating position by recognizing the geography or pattern of the ground, a biometric sensor 3509 for user authentication, a temperature/humidity sensor 3510 for measuring temperature and humidity, an illuminance sensor 3511 for measuring illuminance, and an ultra violet (UV) sensor 3512 for measuring UV light. The sensor module 3500 according to various embodiments may compute the posture of the unmanned aerial vehicle 3001. The posture information of the unmanned aerial vehicle 3001 may be shared with the movement control module 3400.

The memory 3700 according to an embodiment of the present disclosure may include an internal memory 3702 and/or an external memory 3704. The memory 3700 may store commands or data relating to at least one other element of the unmanned aerial vehicle 3001. The memory 3700 may store software and/or a program. The program may include a kernel, middleware, an application programming interface (API), and/or an application program (or "application").

The audio module 3801 according to an embodiment of the present disclosure may convert sound into an electrical signal, and vice versa. The audio module 3801 may include a speaker and a microphone and may process input or output sound information.

The indicator 3802 according to an embodiment of the present disclosure may display a specific state (e.g., an operating state, a charging state, or the like) of the unmanned aerial vehicle 3001 or a part thereof. Alternatively, the indicator 3802 may display a flight state or an operating mode of the unmanned aerial vehicle 3001.

The power management module 3803 according to an embodiment of the present disclosure may manage, for example, electric power of the unmanned aerial vehicle 3001. According to an embodiment, the power management module 3803 may include a power management integrated circuit (PMIC), a charging IC, or a battery or fuel gauge. The PMIC may have a wired charging method and/or a wireless charging method. The wireless charging method may include, for example, a magnetic resonance method, a magnetic induction method, or an electromagnetic method and may further include an additional circuit for wireless charging, for example, a coil loop, a resonant circuit, a rectifier, or the like. The battery gauge may measure, for example, a remaining capacity of the battery 3804 and a voltage, current or temperature thereof while the battery 3804 is charged.

The battery 3804 according to an embodiment of the present disclosure may include, for example, a rechargeable battery.

The camera module 3630 according to an embodiment of the present disclosure may be configured in the unmanned aerial vehicle 3001, or may be configured in the gimbal module 3600 in the case where the unmanned aerial vehicle 3001 includes a gimbal. The camera module 3630 may include a lens, an image sensor, an image processing unit, and a camera control unit. The camera control unit may adjust composition and/or a camera angle (a photographing angle) for a subject by controlling the angle of the camera lens in four directions (up, down, left and right) on the basis of composition information and/or camera control information output from the processor 3020. The image sensor may include a row driver, a pixel array, a column driver, and the like. The image processing unit may include an image pre-processing unit, an image post-processing unit, a still image codec, a video codec, and the like. The image processing unit may be included in the processor 3020. The camera control unit may control focusing, tracking, and the like.

The camera module 3630 according to an embodiment of the present disclosure may perform a photographing operation in a photographing mode. The camera module 3630 may be affected by a movement of the unmanned aerial vehicle 3001 to a certain degree. The camera module 3630 may be located in the gimbal module 3600 to minimize and/or reduce a change in photography of the camera module 3630 due to a movement of the unmanned aerial vehicle 3001.

The movement control module 3400 according to an embodiment of the present disclosure may include various circuitry to control a posture and a movement of the unmanned aerial vehicle 3001 using position and posture information of the unmanned aerial vehicle 3001. The movement control module 3400 may control roll, pitch, yaw, throttle, and the like of the unmanned aerial vehicle 3001 according to obtained position and posture information. The movement control module 3400 may perform autonomous flight operation control and flight operation control according to a received user input command on the basis of a hovering flight operation and autonomous flight commands (a distance movement command, an altitude movement command, a horizontal and azimuth angle command, and the like) provided by the processor 3020. For example, in the case where the unmanned aerial vehicle 3001 is a quad-copter, the unmanned aerial vehicle 3001 may include a plurality of sub-movement control modules 3440 (microprocessor units (MPUs)), a plurality of motor drive modules 3430, a plurality of motor modules 3420, and a plurality of propellers 3410. The sub-movement control modules 3440 (MPUs) may output control data for rotating the propellers 3410 in response to flight operation control. The motor drive modules 3430 may convert motor control data corresponding to an output of the movement control module 3400 into a drive signal and may output the converted drive signal. The motor modules 3420 (or motors) may control rotation of the corresponding propellers 3410 on the basis of drive signals of the corresponding motor drive modules 3430, respectively.

The gimbal module 3600 according to an embodiment of the present disclosure may include various circuitry, for example, a gimbal control module 3620, a gyro sensor 3621, an acceleration sensor 3622, a gimbal motor drive module 3623, and a motor 3610. The camera module 3630 may be included in the gimbal module 3600.

The gimbal module 3600 according to an embodiment of the present disclosure may generate compensation data according to a movement of the unmanned aerial vehicle 3001. The compensation data may be data for controlling at least part of pitch or roll of the camera module 3630. For example, the roll/pitch motor 3610 may compensate for roll and pitch of the camera module 3630 according to a movement of the unmanned aerial vehicle 3001. The camera module 3630 may be mounted on the gimbal module 3600 to cancel a movement caused by rotation (e.g., pitch and roll) of the unmanned aerial vehicle 3001 (e.g., a multi-copter) and thus may stably remain in an erected state. The gimbal module 3600 may allow the camera module 3630 to be maintained at a specific slope irrespective of a movement of the unmanned aerial vehicle 3001, and thus the camera module 3630 may stably take an image. The gimbal control module 3620 may include a sensor module that includes the gyro sensor 3621 and the acceleration sensor 3622. The gimbal control module 3620 may analyze measurement values of the sensor module including the gyro sensor 3621 and the acceleration sensor 3622 to generate a control signal of the gimbal motor drive module 3623 and to drive the motor 3610 of the gimbal module 3600.

Figure 13:
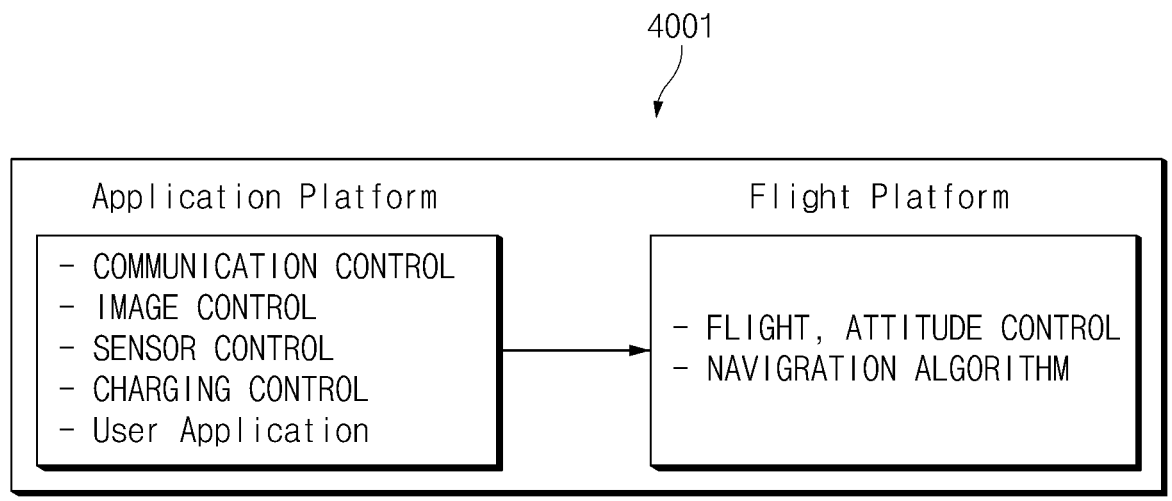
FIG. 13 is a diagram illustrating an example program module (a platform structure) of an unmanned aerial vehicle according to various example embodiments of the present disclosure.

FIG. 13 is a diagram illustrating an example program module (a platform structure) of an unmanned aerial vehicle according to various example embodiments of the present disclosure.

Referring to FIG. 13, an unmanned aerial vehicle 4001 may include an application platform or a flight platform. The unmanned aerial vehicle 4001 may include at least one application platform for operating the unmanned aerial vehicle 4001 and providing a service by receiving a control signal through a wireless link and at least one flight platform for controlling flight depending on a navigation algorithm.

The application platform according to an embodiment of the present disclosure may perform communication control (connectivity), image control, sensor control, and charging control on elements of the unmanned aerial vehicle 4001 and may perform an operation change according to a user application. The application platform may be executed in a processor. The flight platform may execute flight, posture control, or a navigation algorithm of the unmanned aerial vehicle 4001. The flight platform may be executed in the processor or a movement control module. The application platform may send a control signal to the flight platform while performing the communication, image, sensor, and charging controls.

According to various embodiments, the processor may obtain an image of a subject taken through a camera module. The processor may analyze the obtained image to generate a command to pilot the unmanned aerial vehicle 4001. For example, the processor may generate information about the size and moving state of the subject, a relative distance between a photographing device and the subject, altitude information, and azimuth angle information. The processor may generate a tracking flight control signal of the unmanned aerial vehicle 4001 by using the computed information. The flight platform may pilot the unmanned aerial vehicle 4001 (may control the posture and movement of the unmanned aerial vehicle 4001) by controlling the movement control module based on the received control signal.

According to various embodiments, the position, flight posture, angular velocity, and acceleration of the unmanned aerial vehicle 4001 may be measured through a GPS module and a sensor module. Output information of the GPS module and the sensor module may be generated and may be basic information of a control signal for navigation/automatic control of the unmanned aerial vehicle 4001. Information of a barometric pressure sensor capable of measuring altitude through an atmospheric pressure difference according to flight of an unmanned photographing device and information of ultrasonic sensors capable of performing accurate altitude measurement at a low altitude may also be used as basic information. In addition, a control data signal received from a remote controller, battery state information of the unmanned aerial vehicle 4001, and the like may also be used as basic information of a control signal.

The unmanned aerial vehicle 4001 according to an embodiment of the present disclosure may fly using a plurality of propellers. The propellers may change a rotational force of a motor to a propulsive force. The unmanned aerial vehicle 4001 may be referred, for example, and without limitation, to as a quad-copter, a hexa-copter, or an octo-copter according to the number of rotors (propellers), in which the quad-copter has four rotors (propellers), the hexa-copter has six rotors (propellers), and the octo-copter has eight rotors (propellers).

The unmanned aerial vehicle 4001 according to an embodiment of the present disclosure may control the propellers based on a received control signal. The unmanned aerial vehicle 4001 may fly by at least two principles: lift and torque. The unmanned aerial vehicle 4001 may rotate one half the multiple propellers in the clockwise (CW) direction and the other half in the counter clockwise (CCW) direction for rotation. The three-dimensional coordinates of a drone according to flight may be determined by pitch (Y)/roll (X)/yaw (Z). The unmanned aerial vehicle 4001 may tilt forwards, backwards, leftwards, or rightwards to fly. If the unmanned aerial vehicle 4001 tilts, the direction of air flow generated by the propellers (rotors) may be changed. For example, if the unmanned aerial vehicle 4001 tilts forwards, air may flow slightly backwards, as well as upwards and downwards. Accordingly, the unmanned aerial vehicle 4001 may move forwards by the air layer pushed backwards according to the law of action and reaction. The unmanned aerial vehicle 4001 may be tilted in a direction by decreasing the speed of motors on the front side thereof and increasing the speed of motors on the rear side thereof in the corresponding direction. Since this method is common to all directions, the unmanned aerial vehicle 4001 may be tilted and moved by only adjusting the speed of the motor module (rotors).

In the unmanned aerial vehicle 4001 according to an embodiment of the present disclosure, the flight platform may receive a control signal generated by the application platform to control the motor module, thereby controlling the pitch (Y)/roll (X)/yaw (Z) of the unmanned aerial vehicle 4001 and performing flight control according to a moving path.

The terminology "module" used herein may refer, for example, to a unit including one of hardware, software, and firmware or two or more combinations thereof. The terminology "module" may be interchangeably used with, for example, terminologies "unit", "logic", "logical block", "component", or "circuit", and the like. The "module" may be a minimum unit of an integrated component or a part thereof. The "module" may be a minimum unit performing one or more functions or a part thereof. The "module" may be mechanically or electronically implemented. For example, the "module" may include, for example, and without limitation, at least one of a dedicated processor, a CPU, an application-specific integrated circuit (ASIC) chip, field-programmable gate arrays (FPGAs), or a programmable-logic device, or the like, which is well known or will be developed in the future, for performing certain operations.

According to various embodiments of the present disclosure, at least part of a device (e.g., modules or the functions) or a method (e.g., operations) may be implemented with, for example, instructions stored in computer-readable storage media which have a program module. When the instructions are executed by a processor, one or more processors may perform functions corresponding to the instructions. The computer-readable storage media may be, for example, a memory.

The computer-readable storage media may include a hard disc, a floppy disk, magnetic media (e.g., a magnetic tape), optical media (e.g., a compact disc read only memory (CD-ROM) and a digital versatile disc (DVD)), magneto-optical media (e.g., a floptical disk), a hardware device (e.g., a ROM, a random access memory (RAM), or a flash memory, and the like), or the like. Also, the program instructions may include not only mechanical codes compiled by a compiler but also high-level language codes which may be executed by a computer using an interpreter and the like. The above-mentioned hardware device may be configured to operate as one or more software modules to perform operations according to various embodiments of the present disclosure, and vice versa.

Modules or program modules according to various embodiments of the present disclosure may include at least one or more of the above-mentioned components, some of the above-mentioned components may be omitted, or other additional components may be further included. Operations executed by modules, program modules, or other components may be executed by a successive method, a parallel method, a repeated method, or a heuristic method. Also, some operations may be executed.

The control unit may include various processing circuitry, such as, for example, and without limitation, one or more of a microprocessor or any suitable type of processing circuitry, such as one or more general-purpose processors (e.g., ARM-based processors), a Digital Signal Processor (DSP), a Programmable Logic Device (PLD), an Application-Specific Integrated Circuit (ASIC), a Field-Programmable Gate Array (FPGA), a Graphical Processing Unit (GPU), a video card controller, or the like. In addition, it would be recognized that when a general purpose computer accesses code for implementing the processing shown herein, the execution of the code transforms the general purpose computer into a special purpose computer for executing the processing shown herein. Any of the functions and steps provided in the Figures may be implemented in hardware, software or a combination of both and may be performed in whole or in part within the programmed instructions of a computer. In addition, an artisan understands and appreciates that a "processor" or "microprocessor" may be hardware in the claimed disclosure.

While the present disclosure has been illustrated and described with reference to various example embodiments thereof, it will be understood by those skilled in the art that various changes in form and details may be made therein without departing from the spirit and scope of the present disclosure as defined by the appended claims and their equivalents.

What is claimed is:

1. An unmanned aerial vehicle comprising:
   a housing;
   an inner structure disposed in the housing;
   wherein the inner structure includes a first surface substantially perpendicular to a first direction and a plurality of sidewalls substantially perpendicular to the first surface, the first surface and the plurality of sidewalls forming an inner space positioned in a central area of the housing;
   a battery mounted in the inner space;
   a plurality of propellers connected to the housing, the plurality of propellers configured to rotate about an axis extending in first direction;
   at least one motor configured to operate the plurality of propellers;
   at least one printed circuit board (PCB) mounted on at least one of the plurality of sidewalls; and
   a power management circuit mounted on the at least one PCB and electrically connected with the battery and the at least one motor.

2. The unmanned aerial vehicle of claim 1,
   wherein the housing includes a surface where an opening is formed,
   wherein the opening is at least partially aligned with the inner space in the first direction,
   wherein the at least one PCB includes a first PCB mounted on an outer surface of a first sidewall among the plurality of sidewalls,
   wherein the power management circuit is mounted on the first PCB,
   wherein the battery includes at least one electrical contact point, wherein the first sidewall includes at least one electrical contact point adjacent to the opening, and
wherein the at least one electrical contact point of the first sidewall is electrically connected with the power management circuit and configured to make contact with the at least one electrical contact point of the battery when the battery is inserted into the inner space.

3. The unmanned aerial vehicle of claim 2,
wherein the plurality of sidewalls further comprises a second sidewall perpendicular to the first sidewall, and
wherein the at least one PCB further includes a second PCB mounted on an outer surface of the second sidewall.

4. The unmanned aerial vehicle of claim 3, wherein the second PCB is connected with the first PCB through a first flexible PCB.

5. The unmanned aerial vehicle of claim 4,
wherein the plurality of sidewalls further comprises a third sidewall opposite to the first sidewall, and
wherein the at least one PCB further includes a third PCB mounted on an outer surface of the third sidewall.

6. The unmanned aerial vehicle of claim 5, wherein the third PCB is connected with the second PCB through a second flexible PCB.

7. The unmanned aerial vehicle of claim 6, further comprising:
at least one processor and/or sensor mounted on the third PCB.

8. The unmanned aerial vehicle of claim 1, wherein the inner structure is arranged in an area other than an area corresponding to operating ranges of the plurality of propellers.

9. An unmanned aerial vehicle comprising:
a housing arranged in a first direction, wherein the housing includes at least four housing sidewalls and an opening defined by the housing sidewalls, the opening formed to receive a battery pack, the at least four housing sidewalls being extended in substantially the first direction;
a propeller support extending a specific distance from each housing sidewall in a second direction away from the center of the housing and perpendicular to the first direction, the propeller support having, on a distal end thereof, a motor and a propeller connected to the motor; and
a PCB assembly disposed on at least one of the housing sidewalls, the PCB assembly associated with operating the motor and the propeller.

10. The unmanned aerial vehicle of claim 9, wherein the PCB assembly comprises:
a first PCB on which a power management circuit associated with operating the motor is mounted, the first PCB configured to be directly connected to the battery pack when the battery pack is inserted into the housing.

11. The unmanned aerial vehicle of claim 10, further comprising:
a camera configured to take an image,
wherein the PCB assembly consists of:
the first PCB;
a second PCB on which a control circuit associated with operating the camera is mounted, the second PCB being disposed on a housing sidewall adjacent to the first PCB; and
a first flexible PCB configured to electrically connect the first PCB and the second PCB.

12. The unmanned aerial vehicle of claim 10, further comprising:
a third PCB disposed on a bottom of the housing and including electrical contact points configured to be electrically connected with the motor; and
a second flexible PCB electrically connected with the first PCB and the third PCB.

13. The unmanned aerial vehicle of claim 9, wherein the battery pack is configured to be inserted into the housing through the opening of the housing, and
wherein the battery pack includes:
a prismatic part mounted in the housing;
a cover disposed on an upper end of the prismatic part and coupled with upper ends of the housing sidewalls that define the opening of the housing; and
a connector electrically connected with the PCB assembly.

14. The unmanned aerial vehicle of claim 13, wherein the housing sidewalls include a contact groove configured to electrically connect at least part of the PCB assembly and the connector, and
wherein the PCB assembly includes a board contact configured to be disposed in the contact groove and electrically connected with the connector.

15. The unmanned aerial vehicle of claim 9, wherein the housing sidewalls include at least one fixation recess configured to fix the PCB assembly.

16. The unmanned aerial vehicle of claim 9, further comprising:
a camera support extending a specific distance from a first corner formed by the housing sidewalls in a third direction away from the center of the housing and perpendicular to the first direction, the camera support having a camera disposed on a distal end of the camera support.

17. The unmanned aerial vehicle of claim 16, further comprising:
a sensor support extending a specific distance from a second corner formed by the housing sidewalls in a fourth direction that is away from the center of the housing and is perpendicular to the first direction and opposite to the third direction, the sensor support having a sensor disposed on a distal end of the sensor support.

18. The unmanned aerial vehicle of claim 17, further comprising:
at least one dummy support extending from corners of the housing at which the camera support part and the sensor support part are not disposed, in a direction away from the center of the housing and perpendicular to the first direction while forming a specific angle with the third or fourth direction on a horizontal plane.

19. The unmanned aerial vehicle of claim 9, further comprising:
a protective structure configured to surround the housing and the propeller support part.

20. An unmanned aerial vehicle comprising:
a battery pack;
a casing arranged in a first direction and including at least four casing sidewalls and an opening defined by the casing sidewalls, the opening being formed to receive the battery pack;
a housing configured to receive the casing;
a PCB disposed on at least one of sidewalls of the housing, the sidewalls of the housing being extended in substantially the first direction;

a motor configured to operate under control of the PCB;
a propeller connected to the motor;
a camera configured to take an image under control of the PCB;
a sensor configured to perform a specified sensing operation under control of the PCB; and
a mesh-type protective structure configured to fix the housing and the motor and to surround the housing and the propeller.

* * * * *